United States Patent
Zaplana

(10) Patent No.: US 10,367,489 B2
(45) Date of Patent: Jul. 30, 2019

(54) SYSTEMS AND METHODS FOR TRANSFERRING POWER ACROSS AN ISOLATION BARRIER

(71) Applicant: Analog Devices Global, Hamilton (BM)

(72) Inventor: Ricardo Zaplana, Limerick (IE)

(73) Assignee: Analog Devices Gloval, Hamilton (BM)

( * ) Notice: Subject to any disclaimer, the term of this patent is extended or adjusted under 35 U.S.C. 154(b) by 0 days.

(21) Appl. No.: 15/783,930

(22) Filed: Oct. 13, 2017

(65) Prior Publication Data

US 2018/0109246 A1 Apr. 19, 2018

Related U.S. Application Data

(60) Provisional application No. 62/408,017, filed on Oct. 13, 2016.

(51) Int. Cl.
*H02J 50/12* (2016.01)
*H02J 5/00* (2016.01)
(Continued)

(52) U.S. Cl.
CPC ............ *H03K 5/1252* (2013.01); *H02J 5/005* (2013.01); *H02J 7/025* (2013.01); *H02J 50/12* (2016.02);
(Continued)

(58) Field of Classification Search
CPC ........ H02J 50/12; H02J 5/005; H03B 5/1265; H03B 2200/004; H03B 2201/025;
(Continued)

(56) References Cited

U.S. PATENT DOCUMENTS 6,980,039 B1 * 12/2005 Dening ................... H02M 1/12
327/164
8,736,343 B2 5/2014 Chen et al.
(Continued)

FOREIGN PATENT DOCUMENTS

| EP | 2 151 906 A2 | 2/2010 |
|---|---|---|
| EP | 2 400 631 A1 | 12/2011 |
| WO | WO 2004/100473 A2 | 11/2004 |

OTHER PUBLICATIONS

International Search Report and Written Opinion dated Mar. 14, 2018 in connection with International Application No. PCT/IB2017/001412.
(Continued)

*Primary Examiner* — William Hernandez
(74) *Attorney, Agent, or Firm* — Wolf, Greenfield & Sacks, P.C.

(57) ABSTRACT

It is often desirable to transmit data between circuits or components operating at a relatively high voltage and circuits operating at a relatively low voltage. Such a task can be performed by use of an isolator. Some isolator designs use magnetic coupling to transfer the data as this is more robust against inadvertently transmitting high voltage transients than capacitor based isolators. However it is often desirable to encode the data for exchange across the transformer of the isolator and decode after transmission across the transformer. This requires power for the encoding and decoding circuits. To ensure both sides are powered, power may be transferred by another transformer. The transformer primary is driven by an oscillating signal. The system disclosed in some embodiments herein varies the frequency of the oscillating signal to mitigate the risk of it interfering with other circuits or systems associated with the isolator.

20 Claims, 14 Drawing Sheets

(51) Int. Cl.
- *H03K 3/84* (2006.01)
- *H03K 5/1252* (2006.01)
- *H03B 5/12* (2006.01)
- *H03K 3/017* (2006.01)
- *H02M 3/335* (2006.01)
- *H02J 7/02* (2016.01)
- *H04B 5/00* (2006.01)

(52) U.S. Cl.
CPC ... *H02M 3/33523* (2013.01); *H02M 3/33569* (2013.01); *H03B 5/1265* (2013.01); *H03K 3/017* (2013.01); *H03K 3/84* (2013.01); *H04B 5/0075* (2013.01); *H03B 2200/004* (2013.01); *H03B 2201/025* (2013.01); *Y02B 70/1433* (2013.01)

(58) Field of Classification Search
CPC ........ H03K 3/017; H03K 3/84; H03K 5/1252; H04B 5/0075
USPC .................................................. 327/164, 551
See application file for complete search history.

(56) References Cited

U.S. PATENT DOCUMENTS

| | | |
|---|---|---|
| 2006/0120115 A1 | 6/2006 | Chen et al. |
| 2008/0311862 A1 | 12/2008 | Spina et al. |
| 2009/0206960 A1 | 8/2009 | Ng et al. |
| 2012/0099345 A1 | 4/2012 | Zhao et al. |
| 2012/0153964 A1 | 6/2012 | Chen et al. |
| 2013/0249479 A1 | 9/2013 | Partovi |
| 2013/0278438 A1 | 10/2013 | Mueck |
| 2016/0080182 A1 | 3/2016 | Yun et al. |

OTHER PUBLICATIONS

International Preliminary Report on Patentability dated Apr. 25, 2019 in connection with International Application No. PCT/IB2017/001412.

* cited by examiner

PRIOR ART  FIG. 4

SYSTEMS AND METHODS FOR TRANSFERRING POWER ACROSS AN ISOLATION BARRIER

RELATED APPLICATIONS

This Application claims the benefit under 35 U.S.C. § 119(e) of U.S. Provisional Application Ser. No. 62/408,017, entitled "SYSTEMS AND METHODS FOR TRANSFERRING POWER ACROSS AN ISOLATION BARRIER" filed on Oct. 13, 2016, which is hereby incorporated herein by reference in its entirety.

FIELD OF THE DISCLOSURE

The present disclosure relates to systems and methods for transferring power across an isolation barrier and to modifying a spectral distribution of an oscillating signal used for transferring the power. The disclosure also relates to integrated circuits including data isolator channels and power transfer circuits for powering the circuits in the data isolator channels such that data can be communicated between first and second voltage domains.

BACKGROUND

It is known to provide systems for transferring electrical power from a first side of an isolation barrier to a second side of the isolation barrier. For instance, components inside a chip scale package may function in two separate voltage domains, each voltage domain being on a different side of the isolation barrier. The voltage domain on the first side of the isolator may be a relatively low voltage domain and, as such, may be provided with a low voltage power source and ground connection. Conversely, the voltage domain on the second side of the isolator may be higher or potentially unknown. Alternatively, even if it is nominally the same as the first voltage domain operational considerations or response to fault conditions may still make Galvanic isolation desirable. The isolator contains an isolation barrier to galvanically isolate the first side from the second side such that electronic components on the first side of the isolation barrier are not damaged by high, unexpected or unknown voltages and currents on the second side, but in such a way that circuits or systems in the two separate voltage domains can communicate.

Power may need to be transferred from the first side of the isolation barrier to the second side, for example, so as to power electronic components on the second side such as data receivers and transmitters used to propagate data across the isolation barrier. Additionally, data or control signals may need to be transferred between the different voltage domains in order to initiate and control the transfer of power from the first side to the second side of the isolation barrier.

The operation of the system when providing power from the first side of the isolation barrier to components on the second side of the isolation barrier may cause the generation of unwanted electrical interference or noise. This electrical noise may be problematic for electrical components which are in close proximity to the power transfer system. Accordingly, there is an ongoing desire to develop systems and methods for handling interference generated when transferring electrical power or charge across an isolation barrier.

SUMMARY OF THE DISCLOSURE

In a first aspect of this disclosure there is provided a power transfer system for transferring power across an isolation barrier. The power transfer system comprises a transformer having a primary winding on a first side of the isolation barrier and a secondary winding on a second side of the isolation barrier. The power transfer system also comprises an oscillator configured to establish in the primary winding of the transformer an oscillating power signal which is transferred to the secondary winding of the transformer. The system also comprises means configured to dither a parameter of the oscillating power signal to modify a spectral distribution of noise generated by the system.

There is also provided an isolator contained in a chip scale package and adapted to transfer data between first and second voltage domains, the isolator having circuits therein powered by a power transfer system operable to add a variation or perturbation to an oscillator used as part of the power transfer system.

There is further provided a method of transferring power across an isolation barrier, the method comprising: generating an oscillating power signal on a first side of the isolation barrier; transferring the oscillating power signal from the first side of the isolation barrier to a second side of the isolation barrier; and dithering the oscillating power signal to modify a spectral distribution of the oscillating power signal.

There is further provided a system for transferring power across an isolation barrier, the system comprising an isolator and a transformer spanning first and second sides of the isolation barrier, the transformer having a primary winding on the first side of the isolation barrier and a secondary winding on the second side of the isolation barrier. An oscillator on the first side of the isolation barrier is configured to provide an oscillating power signal to the primary winding of the transformer. A power receiver on the second side of the isolation barrier is coupled to the secondary winding of the transformer and configured to store electrical charge from the transferred oscillating power signal in a charge storage device. A control circuit is coupled to the power receiver so as to determine a voltage at the charge storage device, and is configured to generate a pseudo random number or sequence which changes value at a rate based on the voltage. An oscillator driver is coupled to the controller, via the isolator, so as to receive the pseudo random number and control the oscillator to establish the oscillating power signal in accordance with the pseudo random number or sequence.

According to an embodiment, a method of transferring power across an isolation barrier is provided. The method comprises generating an oscillating power signal in a first side of the isolation barrier; transferring the oscillating power signal from the first side of the isolation barrier to a second side of the isolation barrier; storing electrical charge from the transferred oscillating power signal at the second side of the isolation barrier; generating a pseudo random number which changes value at a rate based on an amount of electrical charge stored at the second side of the isolation barrier; and transferring the pseudo random number from the second side of the isolation barrier to the first side of the isolation barrier such that the oscillating power signal is generated in accordance with the pseudo random number value.

According to an aspect of the application, a system for transferring power across an isolation barrier is provided. The system comprises a transformer having a primary winding on a first side of the isolation barrier and a secondary winding on a second side of the isolation barrier; an oscillator coupled to the primary winding and configured to establish in the primary winding an oscillating power signal;

and a dither circuit coupled to the oscillator and configured to dither a parameter of the oscillating power signal.

According to an aspect of the application, a method of transferring power across an isolation barrier is provided. The method comprises generating an oscillating power signal in a first side of the isolation barrier; transferring the oscillating power signal from the first side of the isolation barrier to a second side of the isolation barrier; and dithering the oscillating power signal to modify a spectral distribution of the oscillating power signal.

According to an aspect of the application, a system for transferring power across an isolation barrier is provided. The system comprises a transformer separating first and second sides of the isolation barrier, the transformer having a primary winding on the first side of the isolation barrier and a secondary winding on the second side of the isolation barrier; an oscillator on the first side of the isolation barrier configured to provide an oscillating power signal to the primary winding of the transformer; a power receiver on the second side of the isolation barrier coupled to the secondary winding of the transformer to receive the oscillating power signal; a control circuit coupled to the power receiver and configured to generate a pseudo random number or sequence; and an oscillator driver coupled to the control circuit and configured to drive the oscillator to establish the oscillating power signal based on the pseudo random number or sequence.

BRIEF DESCRIPTION OF THE DRAWINGS

Embodiments of the present disclosure will be better understood and readily apparent to one of ordinary skill in the art from the following written description, given by way of example only, and in conjunction with the drawings, wherein like reference signs relate to like components, in which.

DETAILED DESCRIPTION

Overview

Various embodiments of this disclosure relate to systems and methods for transferring electrical power or charge across an isolation barrier. Specific embodiments relate to modifying a spectral distribution of a signal generated when transferring the electrical power.

Figure 1:
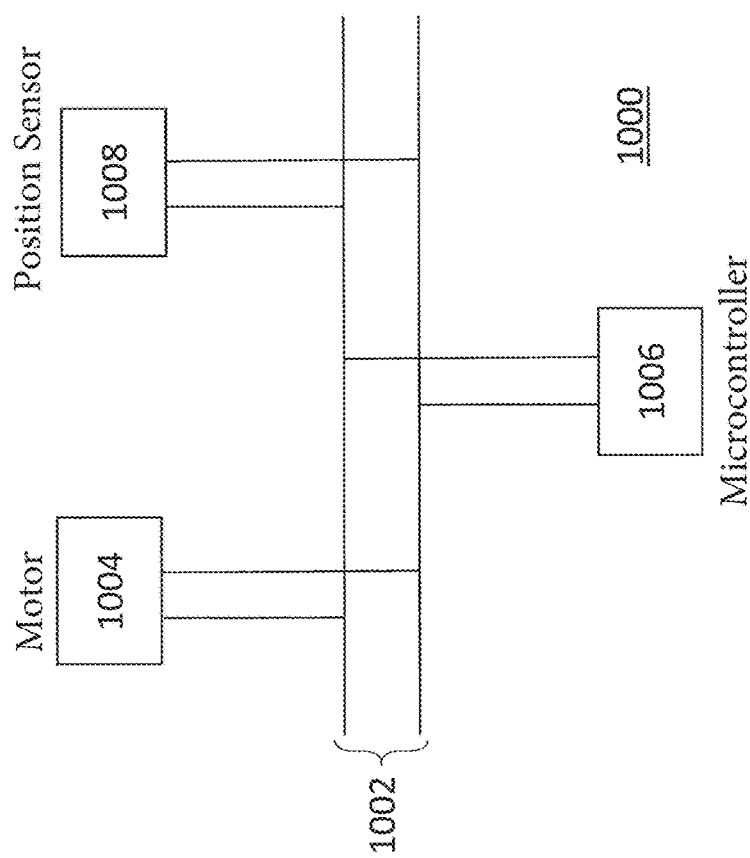
FIG. 1 is a block diagram of part of a system which represents an example environment within which various embodiments of the disclosure may operate.

FIG. 1 illustrates an example environment within which various embodiments may operate. Specifically, the environment illustrates part of a machine 1000 for carrying out a process, such as an industrial manufacturing process. It is to be understood that the following example is disclosed only to provide a non-limiting context within which some embodiments of this disclosure may operate or be used. Other embodiments may operate within different environments, for example, within different electronic devices. Example electronic devices can include, but are not limited to, consumer electronic products, aerospace products, automotive products, parts of electronic products, electronic test equipment, etc. Example consumer electronic products can include, but are not limited to, wireless devices, a mobile phone (for example, a smart phone with a camera), a computer monitor, a computer, a hand-held computer, a tablet computer, a personal digital assistant (PDA), a microwave, a refrigerator, a stereo system, a DVD player, a CD player, a digital video recorder (DVR), an MP3 player, a radio, a camcorder, a camera, a digital camera, a portable memory chip, a washer, a dryer, a washer/dryer, a copier, a facsimile machine, a scanner, a multi-functional peripheral device, a smart watch, a clock, etc. Further, the electronic device can include unfinished products.

Turning to the example shown in FIG. 1, the machine 1000 includes a controller area network (CAN) bus 1002 which is connected to each of: a motor 1004 with a motor driver circuit, a microcontroller 1006, and a position sensor 1008. The microcontroller 1006 may send motor control signals to the motor 1004 via the CAN bus 1002. The motor 1004 may operate as instructed by the received motor control signals. The position sensor 1008 may be associated with the motor 1004 such that it can determine a position of the motor 1004. The position sensor 1008 may generate motor position data relating to the position of the motor 1004, and the position sensor 1008 may send the motor position data to the microcontroller 1006 via the CAN bus 1002. In this way, the microcontroller 1006 may generate the motor control signals based on the received motor position data.

One or more components of the machine 1000 may operate in a different voltage domain to one or more other components of the machine 1000. For example, the CAN bus 1002 may operate at 5V, the motor 1004 may operate at several hundred volts or more, the microcontroller 1006 may operate at 3V or so, and the position sensor may operate at an unknown voltage. Therefore, between each different voltage domain, it may be desirable or necessary to: (i) isolate one voltage domain from the other voltage domain, and (ii) facilitate transmission of data between the isolated voltage domains. For example, to send motor control signals from the microcontroller 1006 to the motor 1004 and motor driver circuit, the control signals need to be transferred, firstly, from the microcontroller's voltage domain to the CAN bus's voltage domain and, secondly, from the CAN bus's voltage domain to the motor's voltage domain. This may be performed using an apparatus as shown in FIG. 2.

Figure 2:
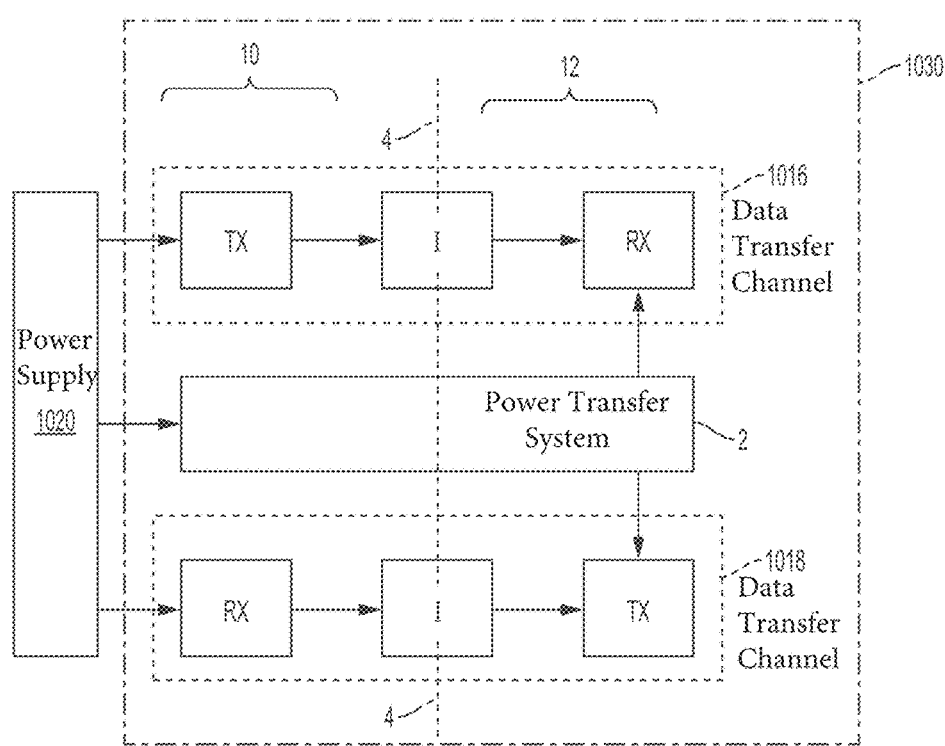
FIG. 2 is a block diagram of an isolation barrier between different voltage domains within the machine of FIG. 1.

As seen in FIG. 2 circuits on a first side 10 of an isolation barrier 4 are separated from circuits on a second side 12 of the isolation barrier 4. The first side 10 may represent the voltage domain of the microcontroller 1006 and the second side 12 may represent the voltage domain of the CAN bus 1002. A first data transmission system 1016 is provided so that data (e.g. motor control signals) can be transferred across the isolation barrier 4 from the first side 10 to the second side 12. Optionally, a second data transmission system 1018 is provided so that data (e.g. motor position data) can be transferred across the isolation barrier 4 and from the second side 12 to the first side 10. Each of the data transmission systems 1016, 1018 includes a transmitter (TX) on one side and a receiver (RX) in the other side. The transmitter and receiver are coupled to each other via an isolator (I) so that the receiver can receive data from the transmitter, but is DC isolated therefrom. In this way, data can be transferred across the isolation barrier 4. The components of the data transfer channels 1016 and 1018, the isolation barrier, the components that transmit data and power from one side of the isolation barrier to the other, one or more receivers and a power transfer system 2 can all be provided in a single integrated circuit style (chip scale) package which may contain the components on one or several dies.

A power supply 1020 is positioned on the first side 10 of the isolation barrier 4 so as to provide electrical power to the electronic components on the first side 10. Additionally, the electronic components on the second side 12 may also require electrical power which can be provided from the power supply 1020. In some instances the status, i.e. there or not, of power at the second voltage domain (side 12) may be unknown, and hence it would be unwise to rely on power of the second voltage domain to power the receiver and transmitters on the second side 12 of the isolation barrier 4 even if the power for them could be reliably obtained from the second voltage domain and converted to an appropriate voltage. For example, if the first voltage domain includes a CPU for controlling a distributed system, then power for the transmitter and receiver in the first voltage domain can be taken directly from the first voltage domain based on the observation that if the CPU is unpowered then the control system will not be functional. If the first voltage domain is powered up, then power can be provided across the isolator to the transmitter and receiver in the second voltage domain so it can be ensured that these devices are operational irrespective of whether power is 'on' in the second voltage domain. Therefore, a power transfer system 2 is provided to transfer power across the isolation barrier 4 from the first side 10 to the second side 12 to provide electrical power to the electronic components on the second side 12.

Various embodiments provide systems and methods which aim to provide the functionality of the power transfer system 2. The following describes an overview of such embodiments.

In an embodiment, a DC power from supply 1020 is DC to AC converted such that power is transferred across the isolation barrier 4, via a transformer. A primary winding of the transformer receives an oscillating power signal which is generated by an oscillator positioned on the first side 10 of the isolation barrier 4. A power receiver (e.g. a rectifier and a storage device), located on the second side 12 of the isolation barrier 4 receives and rectifies the transferred oscillating power signal. A load circuit, also located on the second side of the isolation barrier 4, is arranged to receive power from the power receiver in order to operate. In this way, electrical power can be drawn from a supply 1020 on the first side 10 of the isolation barrier 4 and transferred to the second side 12 of the isolation barrier 4 to power the load circuit. The load circuit may be the receiver of data transmission system 1016 and/or the transmitter of the data transmission system 1018, and/or other components.

The system 2 may include a feedback path (as will be discussed in greater detail later) to control or regulate the transfer of power from the first side 10 of the isolation barrier to the second side 12. Specifically, a driver may control the oscillator to generate the oscillating power signal based on control signals received at the first side 10. The control signals may be generated on the second side 12 of the isolation barrier 4 by a controller. The driver may receive the control signals from the controller by way of a further isolator which straddles the first and second sides of the isolation barrier 4. The controller may generate at least one control signal based on an amount of electrical charge or energy stored by the power receiver or on a supply voltage at one of the loads. Specifically, the driver may activate the oscillator to generate the oscillating power signal based on status, e.g. "enable" or "disable" of the control signal or signals. The control signal may cause power to be transferred from the first side 10 to the second side 12 such that the amount of electrical charge stored by the power receiver sits within an acceptable range, i.e. it meets a minimum requirement for the load circuit to operate, whilst avoiding an overvoltage condition at the second side 12.

The system described above provides for a reliable transfer of power within an integrated circuit package such that key components in the second voltage domain can be powered irrespective of the state of the second voltage domain. This can be exploited to reduce the number of pins in the package if pin-out is restricted or to improve reliability of operation of some components, such as a receiver or a circuit controlling a power switching transistor.

However, the operation of the oscillator coupled to the primary winding of the transformer can be a source of interference to other systems. The interference may be generated in two distinct ways. Firstly, the oscillating power signal may have a constant oscillating frequency so that power transfer across the transformer is efficient, for example because the primary winding is included in an LC tank circuit to enhance the voltage at the primary winding. However, this constant oscillating frequency may, from the perspective of other circuits, cause a noise or interference peak about the oscillating frequency. Since the oscillator output is focussed about a small range of frequencies, the first noise component (at the oscillator frequency) can be problematic for neighbouring electronic components. Secondly, steady-state operation of the system 2 may be cyclical when the power receiver provides power to a constant load. Under such steady state conditions, the control signals may have a substantially constant duty cycle which causes a cyclical charging and discharging cycle with a substantially constant cycle frequency of the power receiver. This cyclical operation may cause a second noise component. Furthermore, these two noise components may combine to generate a combined noise signature having a main noise peak at the oscillation frequency of the oscillating power signal with smaller peaks offset from the oscillator frequency by the cycle frequency of the on/off switching.

To mitigate the negative effects of the first, second and combined noise components on neighbouring electronic components, embodiments of this disclosure include features which dither system parameters to modify a distribution of the oscillator frequency, for example, to spread the noise over a wider frequency range. In this way, the power at a given frequency can be reduced. Hereinafter, this concept will be referred to "noise spreading".

In one approach, a frequency of the oscillator may be dithered to spread noise caused by the oscillating power signal. Specifically, the oscillator may include a dither circuit configured to add a dither to an oscillation frequency of the oscillating power signal. This technique may be applicable to resonant circuits, and indeed to non-resonant circuits as might be used in switched mode power supplies. The dither circuit may include a plurality of separately controllable capacitors coupled to the oscillator and/or the transformer, and the dither circuit may control the plurality of capacitors to vary a capacitance of the dither circuit to add the dither to the oscillating frequency of the oscillating power signal. The value of the capacitors may be controlled in a deterministic manner by a suitable controller. Preferably the dither circuit may include a pseudo random number generator, and the dither circuit may control the plurality of capacitors to vary a capacitance of the dither circuit according to a pseudo random sequence.

Additionally or alternatively, the control cycle period (e.g. the sum of on and off times) of the control signals may be dithered to spread noise caused by the cyclical charging and discharging of the system. Specifically, the controller may be configured to add a dither to the control cycle of the control signal. The controller may be configured to generate a signal which varies based on the amount of electrical charge stored by the power receiver, and the controller may be configured to set the duty cycle or a frequency of the control signal and have activation of the oscillator varied based on the control signal. For example the controller may form the control signal as a difference between a signal representing the stored charge or power receiver output voltage and a threshold. The threshold may be fixed or may be variable. Also, the controller may be configured to dither the difference to add the dither to the control signal. In some systems, the controller may further include a circuit configured to dither a charging current and/or a capacitance of the power receiver circuit to add the dither to the cycle time of activation of the control signal.

Accordingly, the noise components may be spread out over a wider frequency range so as to cause a reduction in the product of magnitude and time of the first and/or, second and/or combined noise components at any specific frequency. In this way, the noise components are less problematic for electronic components which are in close proximity to the power transfer system, such as, those on the same or adjacent integrated chips. In this way, a system may be provided which transfers power across an isolation barrier and meets electromagnetic interference (EMI) emission standards, such as, the EMI Class B standard for residential use.

Example Data Transfer Mechanism

As mentioned above with reference to FIG. 2, the first and second data transmission systems 1016 and 1018 transmit data across the isolation barrier 4. For completeness, before describing specific embodiments of this disclosure in detail, the following provides one example mechanism by which data may be transmitted across the isolation barrier 4, with reference to FIGS. 3 and 4.

Figure 3:
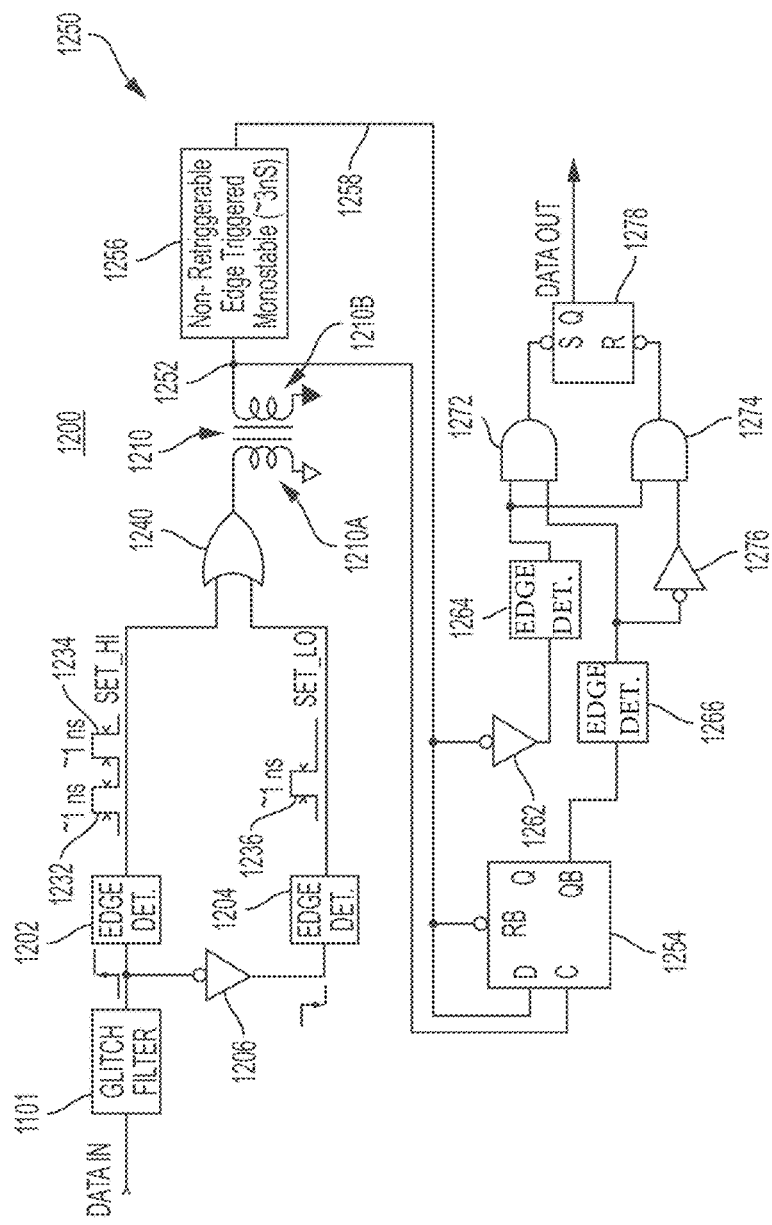
FIG. 3 is an extract from U.S. Pat. No. 8,736,343 for the purposes of illustrating a data transmission system of FIG. 2.
Figure 4:
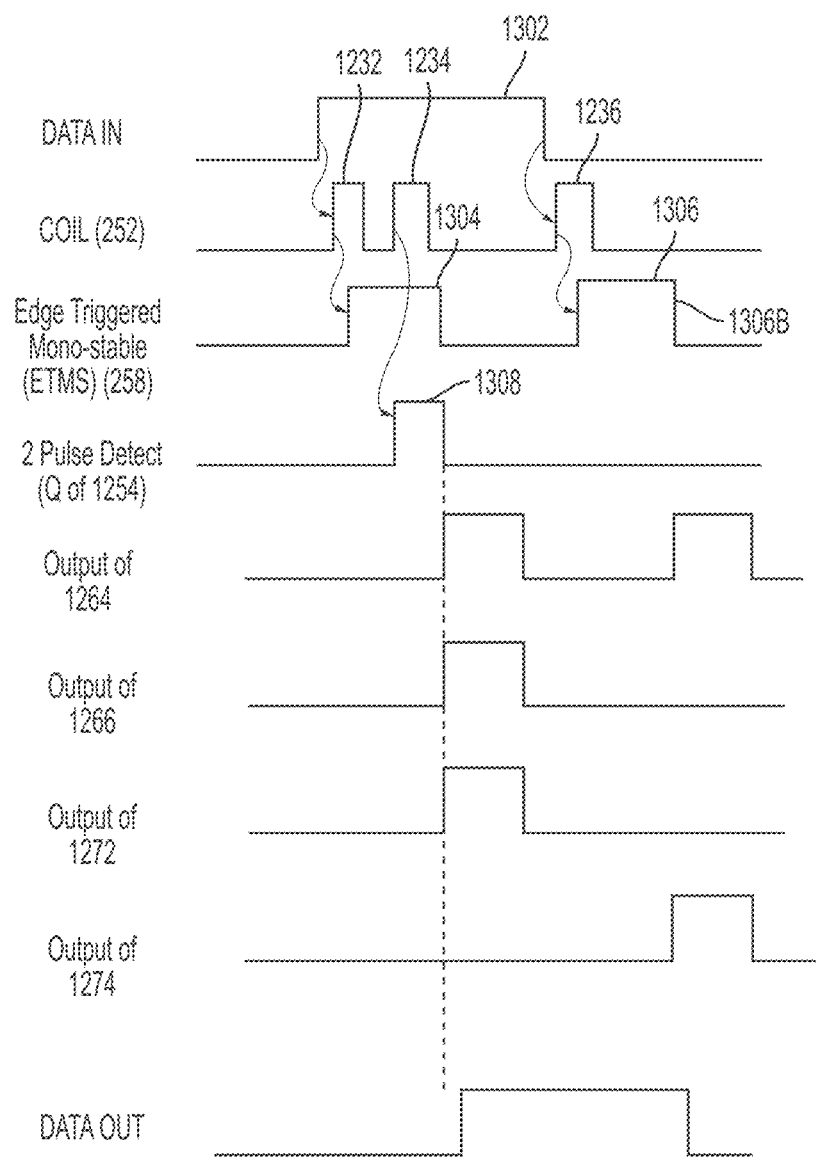
FIG. 4 is a timing diagram to show selected waveforms in the circuit of FIG. 3.

FIGS. 3 and 4 are disclosed in U.S. Pat. No. 8,736,343 owned by Analog devices Inc., which is incorporated herein by reference (and in particular with reference to the teachings of FIGS. 4, 5 and 6 of U.S. Pat. No. 8,736,343 and the associated text where encoding and decoding circuits are described in detail).

FIG. 3 illustrates a logic signal isolator 1200 in which encoded leading and falling edge indicators from a pair of edge detectors 1202 and 1204 are sent to a single microtransformer 1210. The leading edge and falling edge indicators are encoded as different, distinguishable signals. That is, a SET_HI signal output from leading edge detector 1202 is distinct from a SET_LO signal output from falling edge detector 1204. The receiving side circuitry connected to the secondary winding 1210B of transformer 1210 (typically via a Schmitt trigger or other suitable wave-shaping circuit, not shown) then reconstructs the logic edges based on distinguishing between those two signals. It is to be understood that the DATA IN signal of FIG. 3 may represent motor control signal data in the microcontroller 1006 voltage domain, whereas the DATA OUT signal of FIG. 3 may represent the motor control signal data in the CAN bus 1002 voltage domain. In this way, the logic signal isolator 1200 of FIG. 3 may provide an example of the data transmission system 1016 of FIG. 2. Stated differently, the function of the logic signal isolator 1200 may be to take motor control signal data from the microcontroller 1006 and transfer that data across an isolation barrier to the CAN bus 1002. Next, the data can be transferred across a second isolation barrier embedded within a second isolator, via a second logic signal isolator (not shown) which is similar to the FIG. 3. Once transferred a second time, the data can be received by the motor 1004 and its driver so as to control operation of the motor 1004.

Turning to the logic signal isolator 1200, an example is illustrated wherein edge detector 1202 produces two consecutive short pulses 1232 and 1234 as a leading edge indicator and edge detector 1204 produces only a single pulse 1236 as a falling edge indicator. The pulses 1232 and 1234 preferably have a known, fixed spacing between them. If transformer 1210 is a high bandwidth micro-transformer, the pulse widths may be as narrow as 1 ns or even less. The outputs of edge detectors 1202 and 1204 are combined by suitable combinational logic, for example by an OR gate 1240, to drive the primary winding 1210A of the transformer 1210.

The concept is to use two different distinguishable signals. They need not be a single pulse and a double pulse. For example, a narrow pulse (e.g., 1 ns) could be used as one edge indicator and a wider pulse (e.g., 2 ns) could be used as the other edge indicator. It is only necessary that a receiver 1250 be able to distinguish the two signals. The concept lends itself to the use of other distinguishable signals but at the same time, one would not wish to use an unnecessarily complicated arrangement or one which would add any significant delay in signal processing. For signals other than those illustrated, it might be necessary to replace OR gate 1240 with other elements that would effectively combine the output of the edge detectors into a single signal for driving the transformer.

The two pulses in the SET_HI signal have a known, fixed spacing between them. The total duration of the two pulses and the intervening gap between them in the SET-HI signal, if sufficiently short with respect to the shortest interval between two leading edges in the input signal, will permit resolution between the SET-HI and SET_LO pulses.

The receiver circuit 1250, connected to secondary winding 1210B, and hence in the second voltage domain recovers the output of transformer 1210, distinguishes between the SET_HI and SET_LO pulses, and reconstructs the input logic signal as a data out signal. More specifically, the received pulses at node 1252 clock a D-type flip-flop 1254 and also act as the input to a non-retriggerable edge-triggered mono-stable multi-vibrator 1256. The multi-vibrator 1256 puts out a pulse on line 1258 that is of duration at least as long as the combination of pulse 1232 and the interval between pulse 1232 and pulse 1234 in the SET_HI signal. If the two pulses 1232 and 1234 are each approximately 1 ns in duration and the interval between them is of like duration, then the pulse on line 1258 should be at least about 2 ns long; 3 ns is used in this example to allow some "hold" time to facilitate clocking of flip-flop 1254. Line 1258 connects to the D input of flip-flop 1254, to the reset input of that flip-flop and to the input of inverter 1262. The output of inverter 1262 is connected to the input of an edge detector 1264 and the QB output (the complementary output) of flip-flop 1254 is connected to the input of another edge detector 1266. The output of edge detector 1264 is connected to one input of each of AND gates 1272 and 1274. The output of edge detector 1266 is connected to the second input of AND gate 1272 and through inverter 1276 to the second input of AND gate 1274. In turn, the output of AND gate 1272 is connected to the set input of set/reset latch 1278 and the output of AND gate 1274 is connected to the reset input of latch 1278. The DATA OUT signal, corresponding to an isolated and slightly delayed version of the DATA IN signal received by the glitch filter, appears at the Q output of latch 1278.

The operation of this circuit will now be explained with reference to the waveforms of FIG. 4. Assume that the DATA IN input has the waveform 1302. At node 1252, the COIL signal is received. Pulses 1232 and 1234 have been generated by edge detector 1202 in response to the leading, positive-going edge of the input signal and pulse 1236 has been generated by edge detector 1204 in response to the negative-going, trailing edge of the input signal. The edge triggered mono-stable (ETMS) multi-vibrator 1256 generates an output waveform on line 1258 as shown at ETMS. In the ETMS signal, the leading edge of pulse 1232 causes the pulse 1304 to be generated. The monostable 1256 does not do anything in response to the falling edge of pulse 1232 or to either edge of the second pulse 1234. Only after pulse 1304 has been output is the monostable 1256 able to respond to a new input, which it does when it receives the leading edge of pulse 1236. Detection of the leading edge of pulse 1236 causes the outputting of pulse 1306.

The second of the two initial pulses, pulse 1234, is detected and the output signal is formed as follows. When the first pulse 1232 clocks the flip-flop 1254, the D input of the flip-flop still sees a low output from the edge-triggered mono-stable multi vibrator on line 1258. That means the QB output of the flip-flop 1254 is set to a high value and the Q output is set to a low value. When the second pulse 1234 is received and clocks flip-flop 1254, the output of the edge-triggered mono-stable is now high and the QB output of flip-flop 1254 transitions to a low value, meaning that the Q output of flip-flop 1254 goes high as at the leading edge of the pulse 1308 in the "2 Pulse Detect" signal on FIG. 4. This H-L edge is sensed by edge detector 1266, which produces a pulse 1310 to the second (bottom) input of AND gate 1272. The output of the edge-triggered mono-stable is also supplied to the input of inverter 1262. So, after the propagation delay through inverter 1262, edge detector 1264 sees a high-to-low transition (edge) at the output of inverter 1262 and responsively generates a positive-going pulse 1312 to the first (top) input of AND gate 1272 and to a first (top) input of AND gate 1274.

Inverter 1262 is designed to have a propagation delay that is substantially equal to that from the D input to the QB output of flip-flop 1254, Hence, edge detectors 1264 and 1266 produce substantially concurrent output pulses 1310 and 1312 to AND gate 1272. As a result, the output 1314 of AND gate 1272 goes from low to high at the same time and sets the set (S) input of the SR flip-flop 1278; and the Q output thereof, being the DATA OUT signal, goes high. As the second (bottom) input of AND gate 1274 is responsive to the output of edge detector 1266 through inverter 1276, the first and second pulses have no impact on the output of AND gate 1274 and do not affect the output of flip-flop 1278. However, when third pulse 1236 triggers edge-triggered mono-stable 1256, to produce its second output pulse 1306, this results as stated above, in the generation of a pulse at the output of edge detector 1264 upon the falling edge of the mono-stable output pulse. The second input of AND gate 1274 from inverter 1276 will be high at this time because the only time it is low is when the output of edge detector 1266 generates the second pulse detection signal 1308. Therefore, the reset (R) input of flip-flop 1278 sees the output pulse 1316 from AND gate 1274 upon the falling edge of the output pulse from edge detector 1264 (plus propagation delay), and latch 1278 is reset and the DATA OUT signal goes low.

In another embodiment, the logic signal isolator 1200 of FIG. 3 may also include other components, such as, a power switch (not shown), for example in the form of a FET or an insulated gate bipolar transistor, having an input which is coupled to the DATA OUT signal. In this example, the power switch may connected to a further component, such as, the motor 1004. In this way, the motor 1004 may be actuated by the power switch based on the control signal data represented by the DATA IN and DATA OUT signals.

Figure 5:
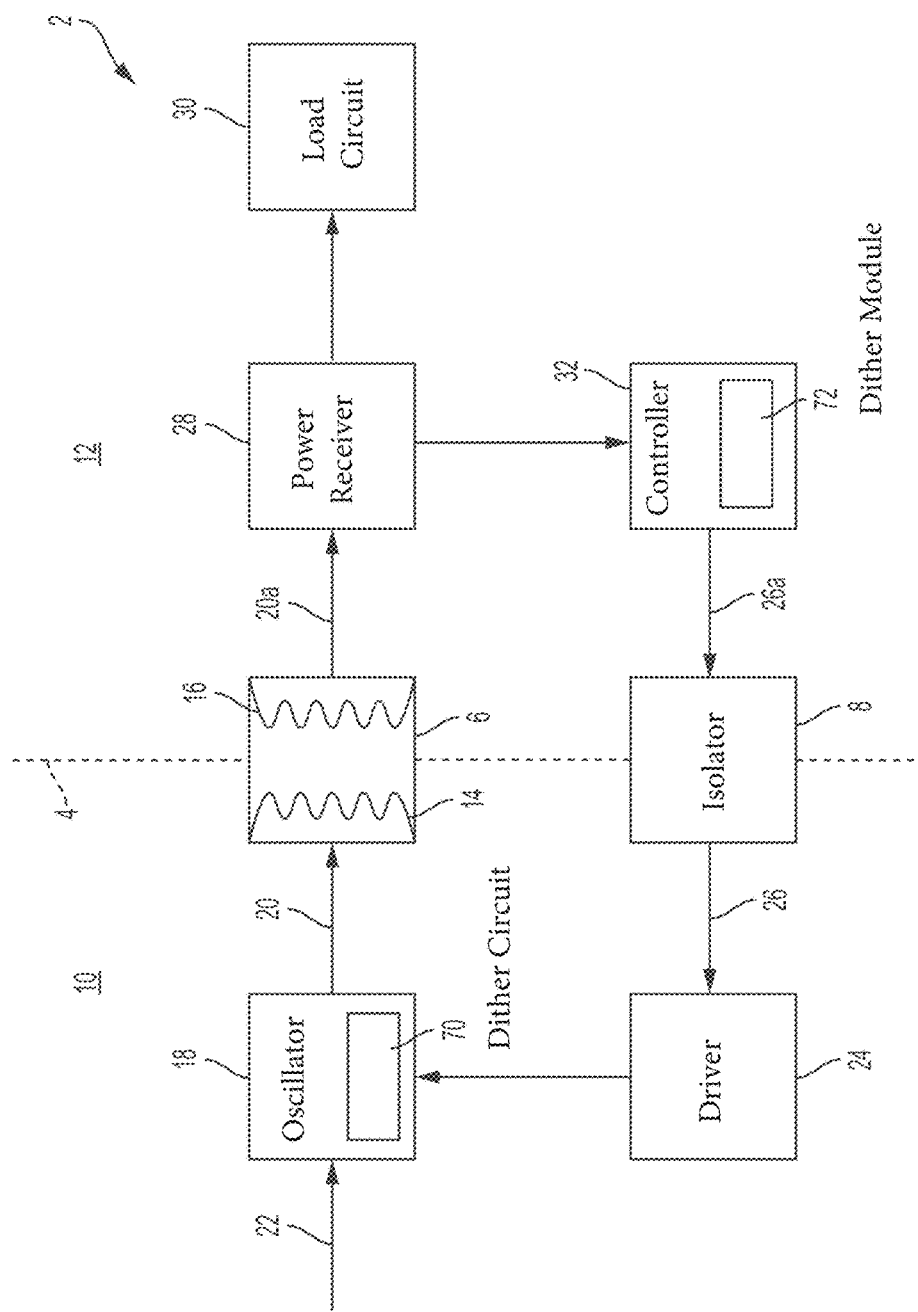
FIG. 5 is a schematic block diagram of a system for transferring electrical power across an isolation barrier, and constituting an embodiment of this disclosure.

FIG. 5 shows an embodiment of a power transfer system 2 in greater detail. The system 2 includes a transformer 6 in a forward power transfer path and an isolator 8 in a feedback path which separates a first side 10 of the isolation barrier 4 from a second side 12 of the isolation barrier 4. The transformer 6 includes a primary winding 14 associated with the first side 10 and a secondary winding 16 associated with the second side 12. The primary and secondary windings may be formed as part of a micro-transformer with the windings on either side of a dielectric layer or dielectric stack. Micro-transformers can be formed over semiconductor substrates using semiconductor fabrication techniques.

An oscillator 18 is positioned on the first side 10 and is coupled to the primary winding 14. The oscillator 18 is configured in use to generate an oscillating power signal 20 in the primary winding 14. The oscillating power signal 20 provides a means by which power can be transferred across the isolation barrier 4. The system 2 may receive a DC power supply 22 and the oscillator 18 acts as a DC to AC converter. Also positioned on the first side 10 is a driver 24. The driver 24 is coupled to the oscillator 18 so as to control operation of the oscillator 18. The driver 24 is coupled to a first portion of the isolator 8 on the first side 10 of the isolation barrier 4. A second portion of the isolator 8 is on the second side 12, and the driver 24 can receive a control signal 26 from the second side 12 via the isolator 8. The control signal 26 provides a means by which control signals for controlling the oscillator 18 can be transferred across the isolation barrier 4. In an embodiment, the control signal 26 is an oscillating signal or it could be a pulse, or a pulse train.

In use, the oscillating power signal 20 at the primary winding 14 of the transformer 6 couples to the secondary winding 16 and induces a signal 20a in it. A power receiver 28 is positioned on the second side 12 is coupled to the secondary winding 16 so as to receive the transferred oscillating power signal 20a. The power receiver 28 is configured to store electrical charge from the transferred oscillating power signal 20a. In this way, power is provided from the first side 10 to the second side 12 across the isolation barrier 4 by way of the transformer 6. As will be discussed in more detail below, the power receiver 28 may include a rectifier, for rectifying the oscillating power signal 20a, and a storage device (e.g. a capacitor), for storing electrical charge from the rectified oscillating power signal 20a. A load circuit 30 may be positioned on the second side 12 and may be coupled to the power receiver 28 so as to receive power therefrom.

In this embodiment, a controller 32 also positioned on the second side 12 is coupled to the power receiver 28 so as to determine an amount of electrical charge stored by the power receiver 28, for example by monitoring the voltage across a reservoir capacitor. The controller 32 may include a circuit (e.g. a voltage divider) for generating a signal which is proportional to the amount of electrical charge stored by the power receiver 28. The controller 32 is configured, in use, to generate the control signal 26a. The control signal 26a defines whether the oscillator should be on or off. In some embodiments of this disclosure the control signal may be a pulse width modulated signal that controls a duty cycle of activation of the oscillator 18. The controller 32 sets the duty cycle of activation based on the determined amount of electrical charge stored by the power receiver 28. The controller 32 is coupled to the second portion of the isolator 8, i.e. the portion of the isolator associated with the second side 12, such that the control signal 26 generated by the controller 32 on the second side 12 of the isolation barrier 4 can be transmitted via the isolator 8 to the driver 24 on the first side 10 of the isolation barrier 4. In this way, control signals for controlling the oscillator 18 can be generated on the second side 12, based on the charge stored by the power receiver 28, and then transferred across the isolation barrier 4 to the first side 10 so that they can be used in controlling the oscillator 18.

The driver 24 controls operation of the oscillator 18 based on the control signal 26 such that the oscillator 18 generates the oscillating power signal 20 in accordance with the duty cycle of activation, i.e. status, of the control signal 26.

Figure 6:
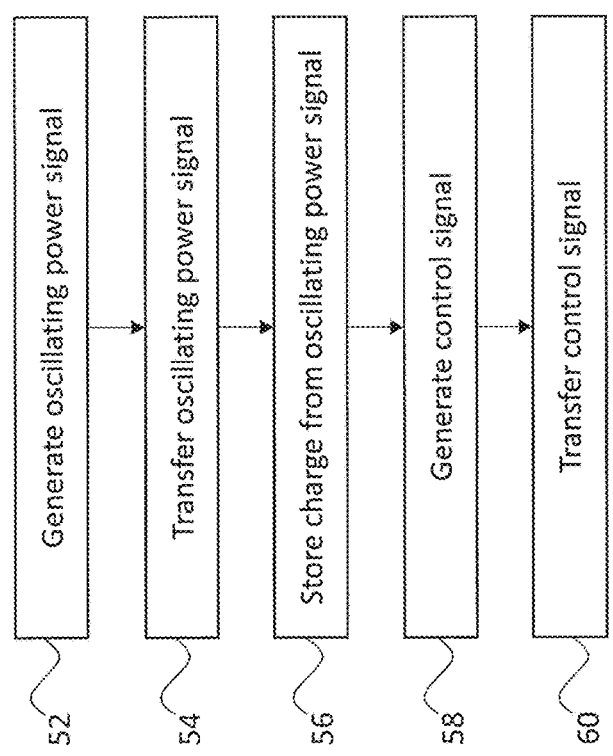
FIG. 6 is a flow diagram of a method for transferring electrical power across an isolation barrier, in accordance with the teachings of this disclosure.

The operation of the system 2 will now be further described with reference to a method 50 of FIG. 6.

At block 52, the oscillating power signal 20 is generated in the first side 10 of the isolation barrier 4. At block 54, the oscillating power signal 20 is transferred from the first side 10 to the second side 12 of the isolation barrier 4. In an embodiment, the oscillating power signal 20 is transferred from the first side 10 to the second side 12 by the transformer 6. As such, the transformer 6 provides a means for transferring the oscillating power signal 20 across the isolation barrier 4.

At block 56, electrical charge is recovered from the transferred oscillating power signal 20 and stored. In an embodiment, the transferred oscillating power signal 20 is received by the power receiver 28 which stores electrical charge from the received signal on a reservoir capacitor. As such, the power receiver 28 provides a means for storing electrical power from the oscillating power signal 20.

At block 58, a control signal 26a is generated (for example, which defines a duty cycle of activation) that is based on an amount of electrical charge stored on a reservoir capacitor (real or parasitic).

At block 60, the control signal 26a is transferred from the second side 12 to the first side 10 such that the oscillating power signal 20 is generated in accordance with the control signal 26.

The above-described system 2 and method 50 are configured to dither a parameter of the oscillating power signal 20 to spread noise generated by the system 2 or the oscillating power signal 20. Specifically, and referring to FIG. 5, in an embodiment the oscillator 18 may include a dither circuit 70 configured to add a dither 20 to an oscillation frequency of the oscillating power signal 20. As such, the dither circuit 70 may provide a means for dithering the oscillation frequency of the oscillating power signal 20. Secondly, the controller 32 may include a dither module 72 configured to add a dither to the duty cycle of activation or the control cycle period of the control signal 26a. As such, the dither module 72 may provide a means for dithering the duty cycle of activation of the control signal 26 and 26a.

The term 'dither' should be taken to mean that a variable is fluctuated, perturbed, varied or changed about its intended value over time. However, the variations in magnitude may be limited in order to minimize by how much the actual value changes from the intended value. For instance, a variable may have an intended value of 60 which may be dithered such that the actual value changes over time as follows: 61, 63, 59, 60, 58, 59, and 61. Accordingly, the variable remains close to its intended value of 60, but the variable also fluctuates such that the actual value is not constant over a long period of time. In an embodiment, 'dither' may be taken to mean that the actual value is varied by ±K % of the intended value every Y seconds. For example, X may be 5 and Y may be 0.002, such that, if the intended value is 60, the dither may change the actual value to a different number between 57 and 63 (±5%) every 2 milliseconds. Of course, in different embodiments, the values of X and Y may be different. For instance, X may be: 1%, 2%, 3%, 4%, 5%, 7%, 10%, 15% or 20%. Also, Y may be: 100 ns, 150 ns, 500 ns or 1 ms or more.

A more detailed description of the noise generated by the system 2 or the oscillating 10 power signal 20 now follows.

As noted earlier, although the oscillator signal is required for the transfer of power across the transformer, it has the potential to present itself as an interfering signal or noise to other systems. The interference generated by the power transfer system is focused around a small frequency band rather than being spread across a wide frequency range and, as a result, the interference can be problematic for neighboring electronic components, such as other electronic components on the same chip as the system 2 which may be seeking to process signals of a similar frequency. The noise may be a combination of first and second noise components, each of which will be described in more detail below with reference to FIG. 7.

The first noise component may be generated around an oscillation frequency of the oscillator 18. This noise may be focused around or at the oscillation frequency because the transformer 6 may be designed to have a high quality (Q) value. For example, a high Q value may be desirable so that: (i) the transformer 6 has low electrical resistance so as to provide efficient power transfer from the primary winding 14 to the secondary winding 16; and, (ii) the oscillations produced in the primary winding 14 by the oscillator 18 are high in magnitude, again to provide efficient (or at least improved) power transfer from the primary winding 14 to the secondary winding 16. However, a consequence of having a high Q value may be that the oscillations produced in the primary winding 14 by the oscillator 18 are constrained in frequency range such that noise introduced into the supply rails by the operation of the oscillator is also in a narrow frequency range. The second noise component may be generated by the above-described operation of the system 2. For instance, when the power receiver 28 is coupled to the load circuit 30 and the load circuit 30 draws a constant amount of electrical charge, the system 2 may exhibit a cyclical operation. However, it is to be understood that there may be an initial transient operation period before a steady-state cyclical operation is established. In any case, during the steady-state cyclical operation, there is a nominally constant repeating on-off control cycle of activation of the control signal 26. Accordingly, during each cycle of the control signal 26, the oscillator 18 is controlled to generate the oscillating power signal 20 during the same fixed portion of the cycle. For example, the constant duty cycle of activation may be 60% such that for the first 60% of each cycle of the control signal 26, the oscillator 18 is controlled to generate the oscillating power signal 20 and for the remaining 40% of each cycle the oscillator 18 is controlled to generate no oscillating power signal 20. In this way, the system 2 operates in a cyclical manner. 10 The second noise component may be generated by this cyclical operation of the system 2 when in a steady state condition.

It is to be understood that the second noise component may be larger and more pronounced when the load circuit 20 draws a constant load, since this may accentuate the cyclical nature; however, the system 2 may still exhibit a cyclical operation or quasi-cyclical operation even when the load circuit 20 does not draw a constant amount of power. As mentioned above, the first and second noise components may combine together to form a combined noise component or frequency signature. The combined noise 20 may include a main peak at about the oscillation frequency and smaller sidebands at the sum and difference frequencies of the on-off control cycle and the oscillator frequency.

Figure 7:
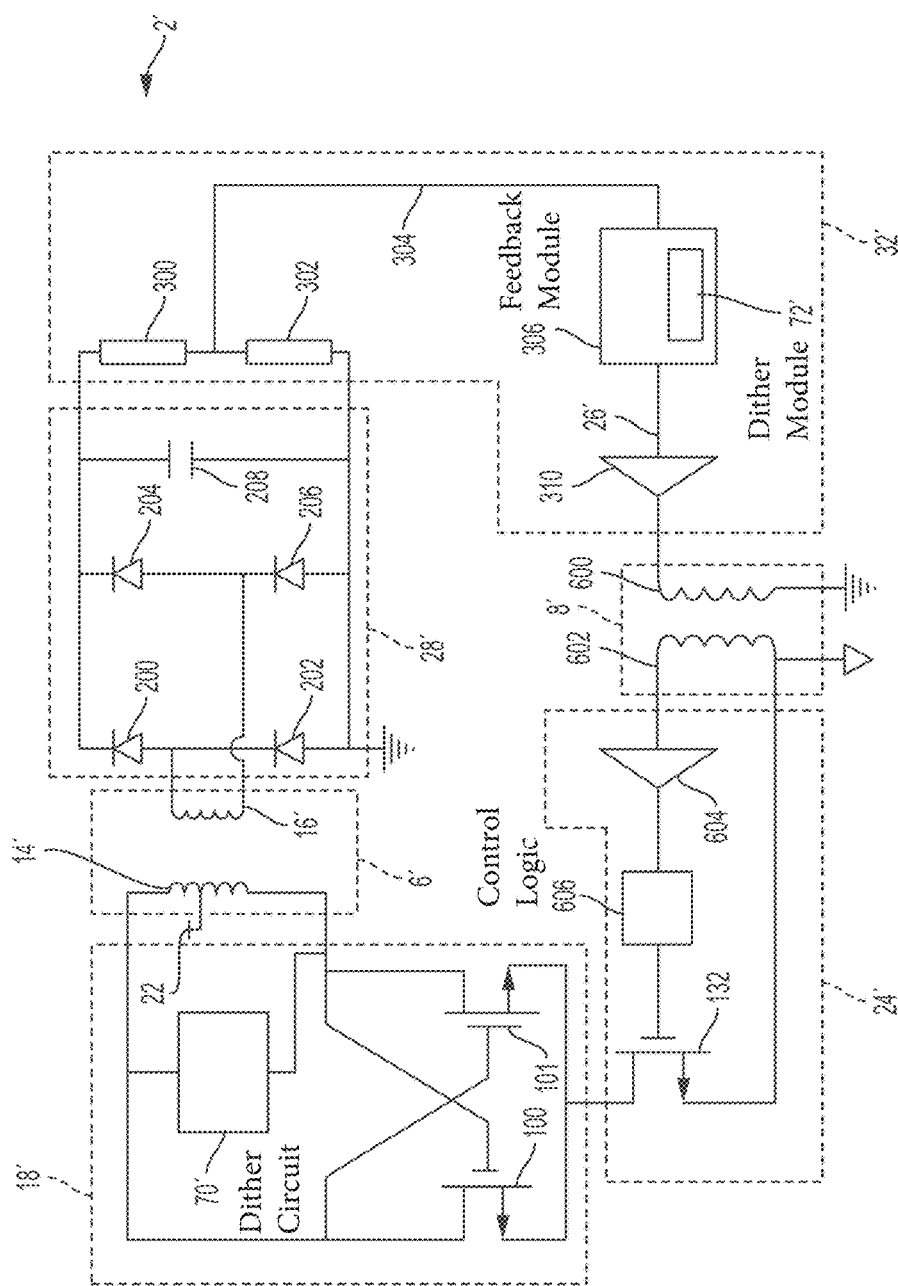
FIG. 7 is a schematic circuit diagram of a system for transferring electrical power across an isolation barrier, in accordance with an embodiment of this disclosure.

FIG. 7 shows an embodiment of a power transfer system 2 for transferring power across an isolation barrier 4'. The system 2' is analogous to the aforementioned power transfer system 2 and operates in an analogous manner. Also, the system 2' includes analogous components to those of system 2. For instance, the system 2' includes an oscillator 18' corresponding to the oscillator 18 of system 2. The following description of system 2' builds on the above description of system 2.

Figure 8:
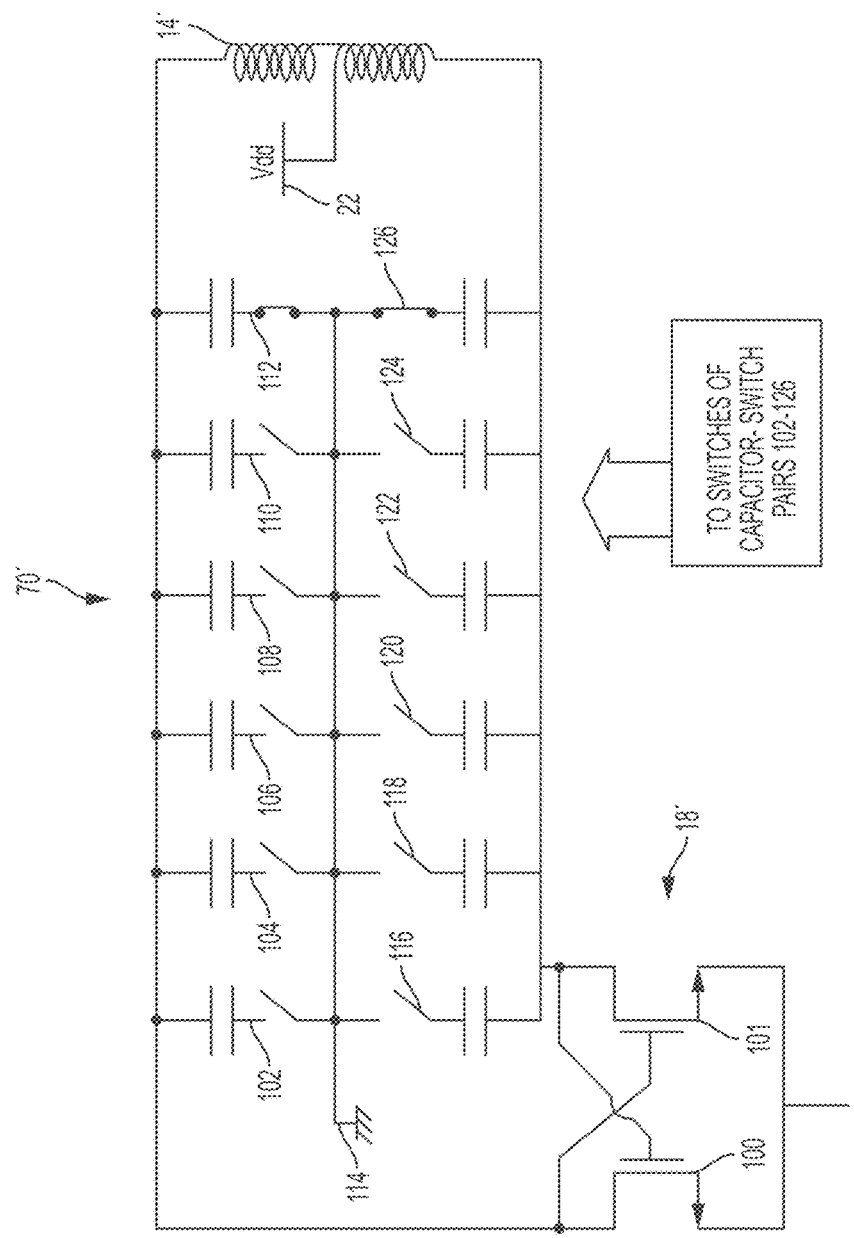
FIG. 8 is a schematic circuit diagram of an oscillator in accordance with an embodiment of this disclosure.

In the embodiment illustrated in FIGS. 7 and 8, the oscillator 18' includes a pair of cross-coupled transistors 100, 101 which are coupled to the first winding 14' of the transformer 6' so as to generate the oscillating power signal 20' in the first winding 14' of the transformer 6'. Specifically, the sources of the transistors 100, 101 are coupled together; the drain of the transistor 100 is coupled to a first side of the center tapped primary winding 14', whereas and the drain of the transistor 101 is coupled to the second side of the primary winding 14'. The gate of the transistor 100 is connected to the drain of the transistor 101, whereas the gate of the transistor 101 is connected to the drain of the transistor 100.

In this embodiment, the oscillator 18' includes a dither circuit 70' configured to add a dither to an oscillation frequency of the oscillator and hence to the frequency of the oscillating power signal 20'. The dither circuit 70' may, as shown in FIG. 8, include a plurality of separately controllable capacitors coupled to the first winding 14' of the transformer 6'. Specifically, the dither circuit 70' may include a plurality of capacitor-switch pairs. The capacitor-switch pairs may be arranged into two separate banks, each bank being connected to a different side of the primary winding 14'. In an embodiment, the first bank may comprise capacitor-switch pairs 102 to 112. The capacitor of each pair 102 to 112 has a first terminal connected to the first side of the primary winding 14', and a second terminal connected to a first terminal of its associated switch. The switch of each pair 102 to 112 has a first terminal connected its associated capacitor, and a second terminal connected to a voltage reference 114, such as one of the supply rails. The second bank may comprise capacitor-switch pairs 116 to 126. The capacitor of each pair 116 to 126 has a first terminal connected to the second side of the primary winding 14', and a second terminal connected to a first terminal of its associated switch. The switch of each pair 116 to 126 has a first terminal connected to its associated capacitor, and a second terminal connected to the voltage reference 114. As an alternative varactor diodes may be used instead of capacitor-switch pairs and the voltage 114 may be dithered.

In the embodiment of FIG. 7, the primary winding 14' is center tapped and the tap is connected to a supply voltage 22. The supply voltage 22 is connected to a point about halfway along the winding 14'. It is to be understood that in some other embodiments, the primary winding 14' may not be center tapped, that is, the supply 22 may be connected closer to, or at, one end of the primary winding.

In the embodiment shown in FIG. 7, the operation of the oscillator 18' is controlled by the driver 24' based on the control signal 26'. The driver 24' activates or deactivates the oscillator 18' by controlling a transistor 132. The operation of the driver 24' will be described in more detail below; however, for now it can be seen that when the transistor 132 is 'on', the sources of transistors 100 and 101 are connected to ground thereby activating the oscillator 18', whereas when the transistor 132 is 'off, the sources of the transistors 100 and 101 are disconnected from ground thereby deactivating the oscillator 18'. Furthermore, when the oscillator 18' is activated by the driver 24', the transistors 100 and 101 with the supply voltage 22 establish an oscillating signal in the primary winding 14, wherein this oscillating signal is the oscillating power signal 20'. Conversely, when the oscillator 18' is deactivated by the controller 24', no oscillating signal is established in the primary winding 14'.

It can be seen that the oscillator 18' circuit provides an inductor-capacitor (LC) oscillator and, in the absence of the dither circuit 70', the inductance and capacitance values are set by the inherent capacitances and inductances of the oscillator 18' circuit. For example, these capacitances include parasitic capacitances of the oscillator 18' circuit, and these inductances include the inductance of the primary winding 14'. Therefore, in the absence of the dither circuit 70, the oscillating power signal 20' will have a substantially constant oscillating frequency corresponding to the capacitances and inductances of the oscillator 18' circuit. The oscillation frequency is substantially constant because, in the absence of the dither circuit 70', the capacitance and inductance values of the oscillator 18' circuit do not change or are substantially invariant. Accordingly, in the absence of the dither circuit 70', when the oscillator 18' is activated, the oscillating power signal 20' has a frequency distribution focused about the resonant frequency, which can be problematic for neighboring electrical components as this potentially large signal (because of the Q factor of the LC circuit) can present itself as interference to those circuits. It is to be understood that in some embodiments, the oscillating frequency may drift slowly as the circuit warms. In an embodiment, the oscillating frequency is nominally 180 MHz but this figure is merely illustrative and the circuit designer can chose substantially different frequencies if he so desires.

As shown in the embodiment illustrated in FIGS. 7 and 8, the dither circuit 70' is connected to the oscillator 18' so as to dither a capacitance (C) of the LC oscillator 18'. Dithering the capacitance in this way dithers the resonant frequency of the oscillator 18' and, therefore, dithers the oscillating frequency of the oscillating power signal 20'. Accordingly, the noise or interference generated by the oscillating power signal 20' can be spread out across a wider frequency range in a time varying manner rather than always being focused at a particular frequency, Spreading out the noise in this way makes the noise less problematic for neighboring electrical components. It is also possible to vary the inductance of the circuit by providing paths that can be shorted out, but this is less preferred as inductors and windings can occupy quite a lot of space.

In an embodiment, each bank of capacitor-switch pairs can be controlled to provide a different amount of capacitance at different times. For instance, the first bank includes pairs 102 to 112, and the capacitor of each pair is separately switchable or controllable by its associated switch. Therefore, the overall bank capacitance can be dithered or varied for different periods of the oscillation power signal 20', For example, in a first period, only the capacitor of pair 102 may be activated such that the capacitance of the oscillator 18' is influenced by pair 102 but not by pairs 104 to 112. Then, in a second period, only the capacitors of pairs 104 and 112 may be activated such that the capacitance of the oscillator 18' is influenced by pairs 104 and 112 but not by pairs 102 and 106 to 110. Then, in a third period, only the capacitors of pairs 104 and 110 may be activated such that the capacitance of the oscillator 18' is influenced by pairs 104 and 110 but not by pairs 102, 106, 108 and 112. This sequence may continue in a deterministic manner or in a random manner. In an embodiment, the first and second banks may operate as one, that is, the first bank may provide the same capacitance at the same time as the second bank. However, in some other embodiments, the first and second banks may provide different capacitances to each other. The capacitors may all have the same value to give a thermometer encoding style of control or they may different from one another, for example by being binary weighted, although this is not limiting and another radix could be chosen to weight the capacitors.

In view of the above, the dither circuit 70' can dither the oscillation frequency of the oscillation power signal 20' over time. Thus, the oscillation frequency at an earlier point in time can be different to the oscillating frequency at a later point in time. This can be accomplished by setting the capacitance of bank 102 to 112 to different values at different times, and/or by setting the capacitance of bank 116 to 126 to different values at different times. For example, in an embodiment of this disclosure the oscillating frequency of 180 MHz may be dithered by about ±11% (i.e. about ±20 MHz) with the frequency being updated around every 150 ns. However this is a non-limiting example and other frequencies, dither sizes and update rates can be selected.

The bank 102 to 112 may mirror the operation of the bank 116 to 126, or the bank 102 to 112 can provide different capacitance values to the back 116 to 126.

In an embodiment, the switching of different pairs 102 to 112 and 116 to 126 may be based on a repeating sequence so as to dither the oscillating frequency in a predictable or deterministic manner. For example, an incrementing counting sequence may be used with a constant counting increment and period. Alternatively, the switching of different pairs 102 to 112 and 116 to 126 may be based on a random sequence so as to dither the oscillating frequency in a random manner. For example, in an embodiment, the dither circuit 70' includes a pseudo random number generator which generates a pseudo random binary sequence.

Figure 9:
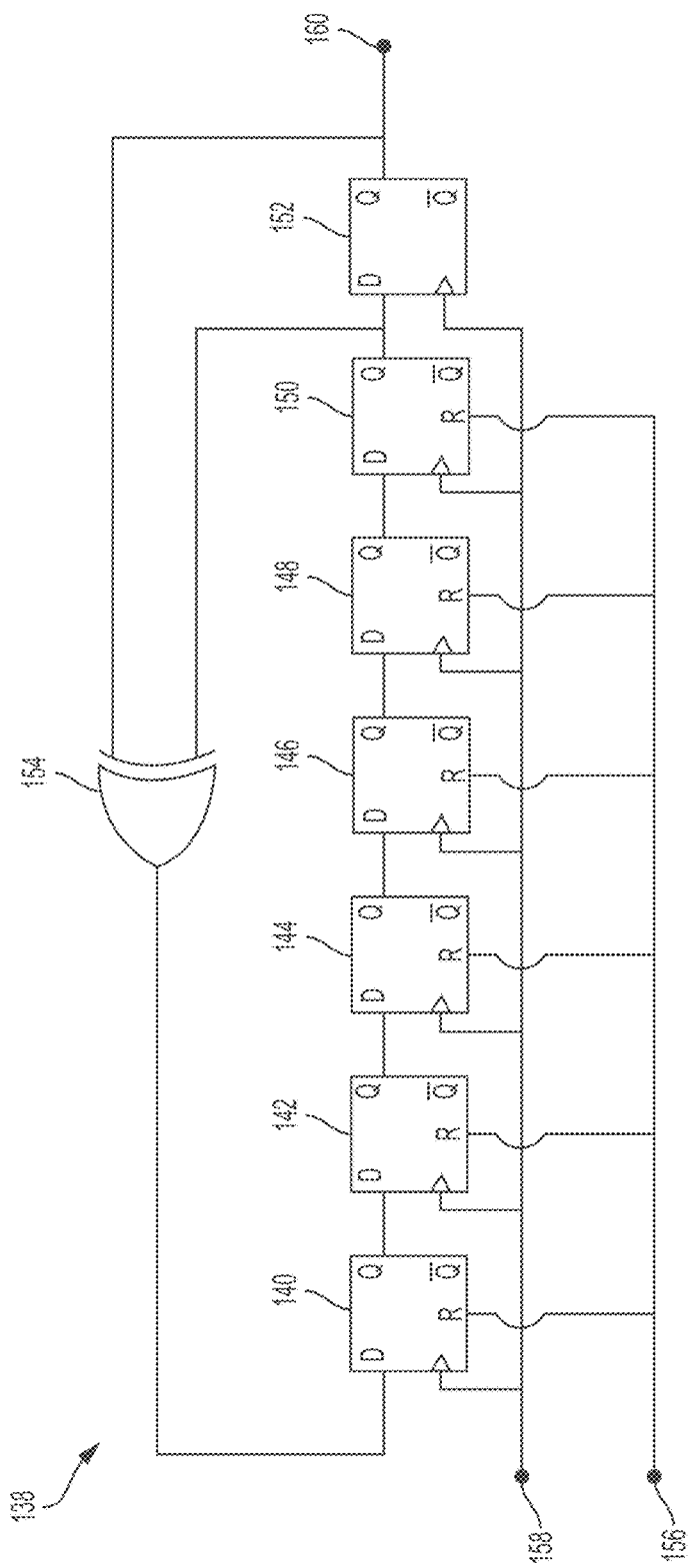
FIG. 9 is a schematic circuit diagram of a pseudo random number generator in accordance with an embodiment of this disclosure.

FIG. 9 shows a pseudo random number generator 138 in accordance with an embodiment of this disclosure. The pseudo-random number generator 138 includes a plurality of flip flops 140 to 152 arranged as a linear feedback shift register, with an exclusive OR (XOR) gate 154 in the feedback path. The flip flops are D-type. A reset pin of each flip flop 140 to 152 is coupled to a reset node 156 of the random number generator 138. A reset signal may be applied to the reset node 156 to reset the flip flops 140 to 152. A clock pin of each flip flop 140 to 152 is coupled to a clock node 158 of the pseudo random number generator 138. A clock signal is applied to the clock node 158 to operate the flip flops 140 to 152. An output pin of each of the flip flops 140 to 150 is coupled to a data pin of the next flip flop; for example, an output pin of flip flop 140 is coupled to a data pin of flip flop 142, output of flip flop 142 is coupled to the input of flip flop 144 and so on, until an output pin of flip flop 150 is coupled to a data pin of flip flop 152.

Additionally, the output pin of flip flops 150 and 152 are coupled to input pins of the XOR gate 154. An output pin of the XOR gate 154 is then coupled to the data pin of flip flop 140. In this way, the output pin of the flip flop 152 provides an output node 160 of the generator 138, and the generator 138 functions to provide a pseudo random serial binary sequence at the output node 160 based on the clock signal (from a suitable clock generator—not shown) applied to the clock node 158. It is to be understood that in some other embodiments a different number of flip flops may be used. Also, in some other embodiments, the inputs of the XOR gate 154 may be coupled to the outputs of a different pair of flip flops. The pseudo-random switch control sequence can also be directly extracted for each of the switches by connecting a switch control node of a given switch to corresponding one of the D-type flip flops. For example the control signals for the switches of the switch-capacitor pairs 102 and 116 may be connected to the data (D) input of the first flip flop 140. Control signals for the switch-capacitor pairs 104 and 118 may be obtained by a connection to the D input of the flip flop 142, and so on.

Returning to FIG. 8, for consecutive periods of oscillation, the capacitor-switch pairs 102 to 112 and 116 to 126 may be controlled in accordance with the pseudo random number so that the dither circuit 70' generates a randomly varying capacitance of the oscillator 18'. For example, in a serial implementation, the pseudo random number may be shifted through the capacitor-switch pairs 102 to 112 and 116 to 126 in order. Alternatively, in a parallel implementation, there may be a capacitor-switch pairs and 30 a-1 flip flops, and the output (Q) pins (or inverted (Q) output pins) of each flip flop and the XOR gate 154 may feed into a different one of the capacitor-switch pairs.

The pseudo random number generator may generate a new pseudo random number or bit every clock cycle of the clock signal applied to clock node 158 or every n oscillating periods, where n can be any positive number such as 1, 10, 20, 27, 30, 64, 100, 256 etc. although powers of 2 tend to be more convenient. As such, the capacitance (and oscillating frequency) may change every n oscillation periods. Alternatively, the pseudo random number generator may generate a new pseudo random number or bit sequence more quickly that the oscillation frequency of the oscillator 18'. As such, the capacitance (and oscillating frequency) may change a plurality of times per oscillation period. It is to be understood that the clock signal applied to the pseudo random number generator controls the rate at which the pseudo random number is generated.

In summary, therefore, in operation, the dither circuit 70' may control a plurality of capacitors to vary a capacitance of the oscillator 18' to add dither to the oscillating frequency of the oscillating power signal 20'. The dither circuit 70' may include a pseudo random number generator, and the dither circuit 70' may control the plurality of capacitors to vary a capacitance of the oscillator 18' based on a pseudo random number generated by the pseudo random number generator.

It is to be understood that in different embodiments, the number of capacitor-switch pairs may vary. For example, the dither circuit 70' may include two banks of one, two, four, five, eight, ten or any reasonable number of pairs. Also, the two banks may have a different number of pairs. For example, one bank may include four pairs and the other bank may include eight pairs. In an embodiment, the capacitance values of the capacitors of each capacitor-switch pair can be the same or may vary between different pairs and/or banks. The dither circuit 70' may include any electronic circuit coupled to the oscillator 18' which is capable of varying or dithering the 30 oscillation frequency of the oscillator 18' over time.

Figure 10:
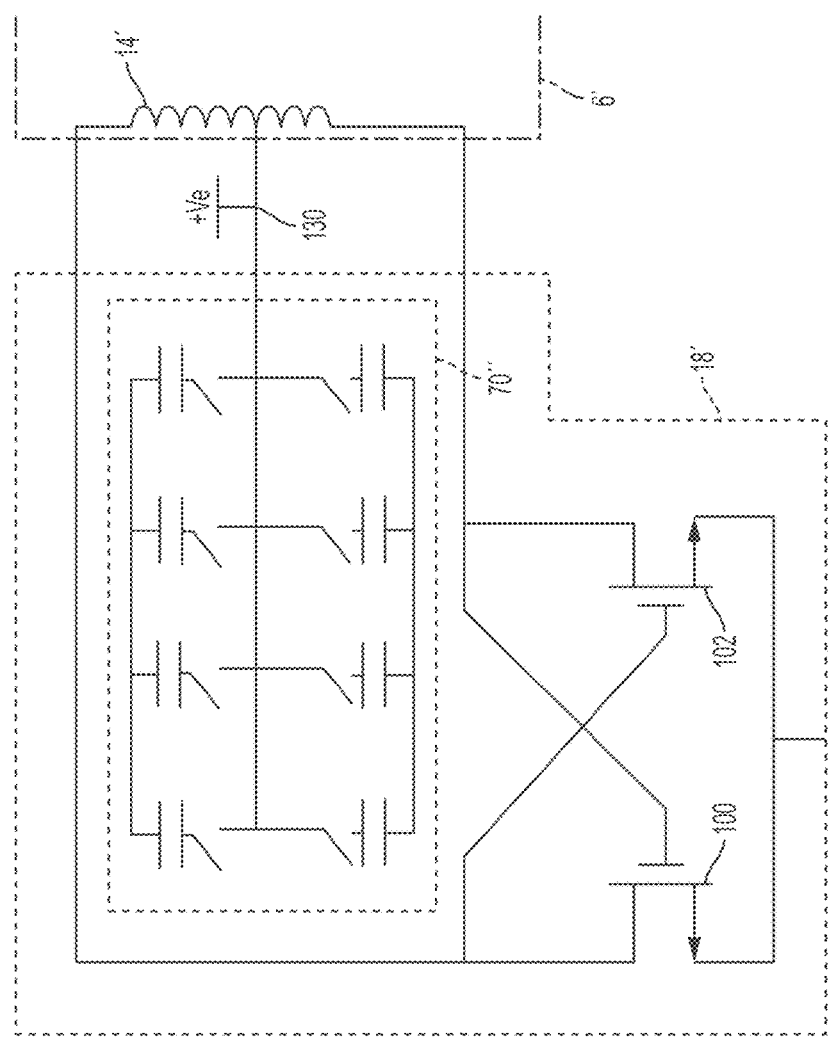
FIG. 10 is a schematic circuit diagram of an oscillator in accordance with another embodiment of this disclosure.

FIG. 10 shows a dither circuit 70" in accordance with another embodiment. The dither circuit 70" includes two banks of four capacitor-switch pairs. However, in contrast to the dither circuit 70', the dither circuit 70" includes capacitor-switch pairs which are connected to the positive power supply 22 rather than to the separate voltage reference 114 or ground. The switches can be formed as P type field effect transistors. However, the operation and possible variations of the dither circuit 70" are as described above with reference to the dither circuit 70'.

The following describes the structure and operation of the power receiver 28' and the monitor 32', with reference to FIG. 7. The power receiver 28' receives the oscillating power signal 20' which has been generated by the oscillator 18', as described above, and transferred from the primary winding 14' to the secondary winding 16' of the transformer 6'. The power receiver 28' includes a rectifier circuit coupled to the secondary winding 16' of the transformer 6'. In the illustrated embodiment, the rectifier circuit includes four diodes 200 to 206 connected in a bridge configuration so as to form a full-wave rectifier. In operation, the rectifier rectifies the oscillating power signal 20' so as to convert the oscillating alternating current (AC) signal, into a direct current (DC) signal. The power receiver 28' further includes a reservoir capacitor 208 coupled to the rectifier circuit so as to be charged by the rectified waveform. A load circuit (not shown) may be coupled to the capacitor 208 so as to receive electrical charge from, and be powered by, the capacitor 208.

The structure of the power receiver 28' may vary in different embodiments. For example, a different rectifier circuit may be used, such as a half-wave rectifier, an active rectifier or a combination of active and diode based rectifiers. Also, a different charge storage device may be used instead of the capacitor 208, such as, for example a battery.

As illustrated the power receiver 28' is coupled to the controller 32' and the controller 32' is configured in use to generate a signal which varies based on the amount of electrical charge stored by the power receiver 28'. Also, the controller 32' may be configured to establish the control signal 26' based on a difference between the voltage across the reservoir capacitor and a threshold. The threshold may be a pre-set threshold which is selected based on a characteristic of the circuits powered by the power receiver 28', and/or the a charging capacity or charging profile of the power receiver 28 The controller 32' is powered from electrical charge stored by the power receiver 28'. As such, in the absence of charge stored on the reservoir capacitor the controller should not inhibit operation of the oscillator.

The controller 32' may include a voltage divider circuit which is connected in parallel with the charge storage device of the power receiver 28', for example, the capacitor 208. The voltage divider may include resistors 300 and 302 and the voltage divider may output a signal 304 representative of the voltage across the reservoir capacitor. This approach saves transistors on the controller circuit having to work with a signal at an input node held at the supply voltage of the controller. Although circuits can be built to operate in this way, it tends to result in a more power hungry circuit.

It is to be understood that in different embodiments, the signal 304 may be something other than a voltage signal, such as, for example, a current signal. Accordingly, the characteristic of the signal 304 which varies based on the amount of stored electrical charge may be something other than voltage. In this case, other elements of the controller 32' may be adapted to operate with a different form of signal, but the general operation of the controller 32' would not change.

In the embodiment as illustrated in FIG. 7, the controller 32' further includes a feedback module 306 which is coupled to the voltage divider so as to receive the signal 304 therefrom. The feedback module 306 generates the control signal 26' which controls activation of the oscillator 18'. Specifically, the feedback module 306 may be configured to control the oscillator 18' based on a difference between the signal 304 and a threshold. As mentioned above, the threshold may be a pre-set threshold which is based on, for example, a charging capacity or a charging time of the capacitor 208. In any case, the feedback module 306 determines a difference between an instantaneous value (e.g. an instantaneous voltage) of the signal 304 and the threshold. The feedback module 306 then generates a control signal based on the difference. This duty cycle of activation is then encoded into the control signal 26'. For example, the control signal 26' may be a pulse width modulated signal or a pulse density modulated signal.

In an embodiment, the threshold value is chosen to ensure that the power receiver 28' is able to maintain a sufficient output voltage to power the load circuit.

Alternatively, the threshold may be adjusted such that the oscillator 18' is periodically powered down to conserve power. The setting of the threshold may be dependent on aspects of the system 2' and/or aspects of the load circuit. The threshold may be pre-set or may be dynamically adjusted depending on operating conditions. As mentioned above, when the power receiver 28' is coupled to a load circuit which draws a constant amount of current, for example because it is in a quiescent state during which there is a constant cycle of activation. This constant cycle causes a cyclical charging and discharging cycle of the power receiver 28' which, in turn, generates an undesirable noise output of the system 2'. In an embodiment, the dither module 72' of the controller 32' is configured to address this noise output by adding a dither to the control cycle such that it is no longer constant. This operation of the dither module 72' will now be described in more detail.

In an embodiment, the dither module 72' adds the dither to the control cycle, for example to the duty cycle of activation by dithering the abovementioned difference calculated by comparing the signal 304 with the threshold. For example, in steady-state conditions the difference may vary in a cyclical manner between a switch on threshold which marks the lowest acceptable voltage before the oscillator should be started, and a switch-off threshold which corresponds to a reservoir capacitor being charged to a target value. Accordingly, the dither module 72' of the feedback module 306 may dither the difference in order to dither the duty cycle of the control cycle.

Other approaches are possible, such as dithering the length (duration) of the control cycle.

Figure 11:
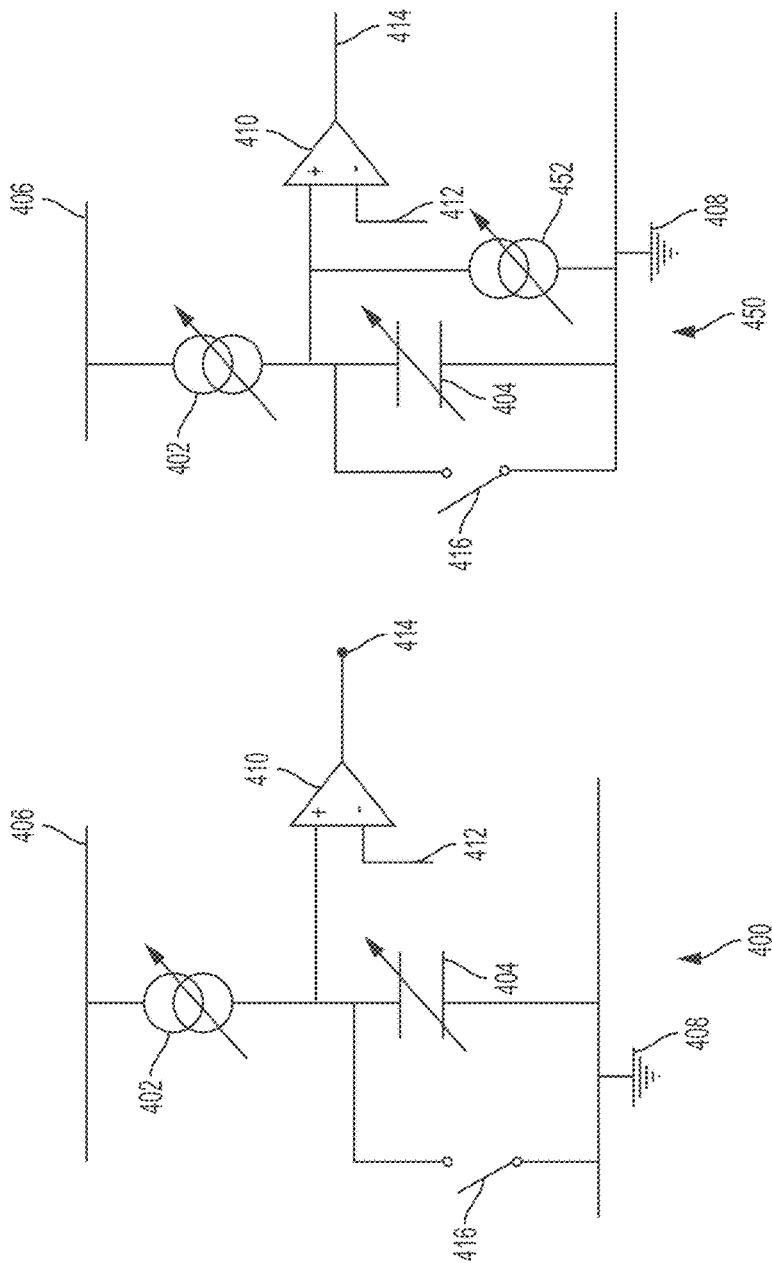
FIG. 11A is a schematic circuit diagram of a circuit of a feedback module of a controller in accordance with an embodiment of this disclosure.
FIG. 11B is a schematic circuit diagram of a circuit of a feedback module of a controller in accordance with another embodiment.

As seen more particularly on FIG. 11A, in an embodiment the feedback module 306 of the controller 32' may include a charging circuit 400 for generating the control signal 26' from, for example, a signal representing the voltage Vcap stored on the reservoir capacitor, in accordance with a pulse width modulation implementation. The circuit 400 acts as a ramp generator which ramps between an initial value and a final value before being reset in a time which corresponds to the cycle time of the controller. The instantaneous value of the ramp is compared to a signal representative of the voltage across the reservoir capacitor and this comparison effectively becomes encoded in the time domain as a pulse width modulated signal. The charging circuit 400 shown in FIG. 11A and being in accordance with the teachings of this disclosure includes a current source 402 connected in series with a capacitor 404 between two power rails 406 and 408 where at least one of the current source 402 and the capacitor 404 is variable in response to a dither word which may be a digital word generated as discussed hereinbefore, for example by a pseudo-random number generator. In an embodiment, rail 406 is a positive supply voltage derived from the power receiver and rail 408 is a local ground. A node between the variable current source 402 and the variable capacitor 404 is connected to a first input, for example the non-inverting input of a differential amplifier 410. A node 412 is connected to a second input, for example an inverting input of the differential amplifier 410. An output of the differential amplifier 410 is connected to an output node 414. A reset switch 416 is connected across the variable capacitor 404. In operation, the differential amplifier 410 adjusts its output signal according to a comparison between the signals on its inverting and non-inverting inputs.

Figure 12:
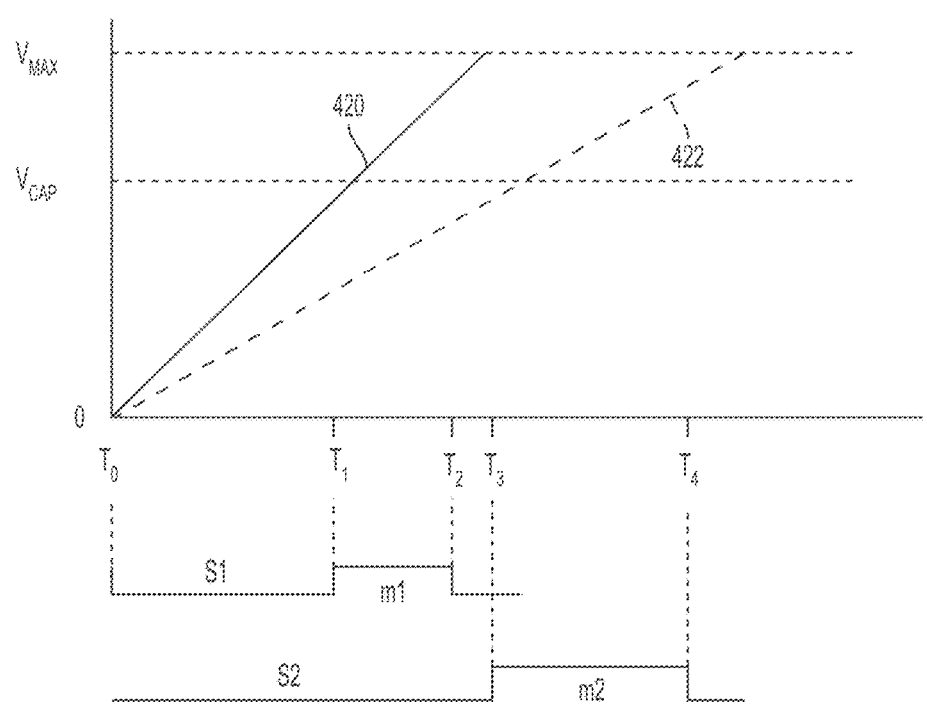
FIG. 12 is a timing diagram relating to the operation of the circuits shown in FIGS. 11A and 11B.

In operation, the control signal 26' is initially set 'low'. The input signal is applied to the node 412 and the reset switch 416 is opened such that the capacitor 404 charges from the current supplied to it by the current source 402 (although a resistor could also be used). Referring to FIG. 12, it can be seen that the voltage across the capacitor of the ramp circuit should rise at a constant rate between an initial value, such as zero, and a final value "Vmax" as indicated by line 420. During the charging process, which in FIG. 12 is commenced at time $T_0$ the differential amplifier 410 compares the voltage across the capacitor 404, i.e. the instantaneous value of voltage as represented by the line 420, with the input voltage at node 412 which is representative of the voltage Vcap across the reservoir capacitor. At the beginning, the voltage across capacitor 404 should be below the input voltage, and the differential amplifier 410 may provide a low voltage at node 414. During this time, the control signal 26' remains 'low'. However, as the capacitor 404 charges and the voltage Vramp across it increases to match and then exceed the input voltage Vcap, the differential amplifier 410 transitions the voltage at node 414 towards the positive supply rail voltage as represented by time $T_1$. When the differential amplifier 410 generates a high value output at node 414, the control signal 26' is transitioned from 'low' to 'high'. The control signal 26' then remains 'high' until the end of the pulse, represented by time $T_2$, at which time the reset switch 416 closed to discharge the capacitor 404. The above-described process is repeated. In this way, the control signal 26' is generated having a series of pulses with a duty cycle (or pulse width) that is set based on the amount of charge stored by the power receiver 28'. It can be seen that the length of the cycle can be changed by varying the size of the current or the size of the capacitor. This is illustrated by line 422 which transitions between 0 volts and Vmax at a slower rate. This can be achieved by reducing the size of the current from the current source 402, increasing the size of the capacitor 404 or a combination of these actions. Now instead of taking a time represented by $T_2$ to complete the generation of the pulse width encoded signal, it now takes a time period $T_4$. It can be seen that the time at which the voltage across the capacitor Vramp matches the input voltage Vcap is now increased from $T_1$ to $T_3$. However the mask-space ratio S1:M1 for the charge rate represented by line 420 is the same as the mark-space ratio S2:M2 for the charge rate represented by the line 422. Thus to a first order approximation the length of the control cycle is varied but the mark-space ratio or duty cycle remains the same. That said, if the control cycle becomes relatively long then the output voltage across the capacitor can start to exhibit excessive variation. It can also be observed that the relative proportion for which the output is high indicating that the oscillator 18 should be energized is relatively short if the voltage across the capacitor is relatively high (indicating a relatively highly charged state) and gets longer the more depleted the charge on the capacitor is.

Based on the above operation, it can be seen that the duty cycle of the control signal 26' will remain constant if the following variables remain constant: the load current; the current of the current source 402; and, the capacitance of the capacitor 404. Under these conditions, the noise generated by the system 2' will be focused around the frequency of this steady-state cyclical operation. Therefore, in order to introduce dither, the dither module 72' is configured to dither one or more of: the input signal (for example be forming a difference between Vcap or a scaled version of Vcap and a threshold, or by varying the resistance of at least one of the resistors in the potential divider); the capacitance of capacitor 404; and, the current of current source 402. Varying the input voltage varies the target voltage of the system, whereas varying the current or capacitance varies the time taken to complete a control cycle, i.e. to ramp from the initial value to the final value of the ramp, and hence the update frequency of the control system changes.

FIG. 11B shows a charging circuit 450 in accordance with another embodiment that is a modification of the circuit shown in FIG. 11A. The charging circuit 450 is the same as the charging circuit 400 of FIG. 11A, however, the charging circuit 450 includes an additional variable current source (acting as a current sink) 452 which is connected in parallel with the capacitor 404. In operation, the additional current source 452 provides another means by which the charging rate of the capacitor 404 can be varied or dithered.

It is to be understood that in some other embodiments, the charging circuit may be different. For example, one of the variable current sources 402, 452 may not be variable; only one of the capacitor 404 or the current source(s) 402, 452 may be variable or only the difference at node 412 may be variable.

Accordingly, the dither module 72' is configured to generate the control signal 26' by comparing the voltage presented at node 412, which may be an attenuated version of the voltage across the capacitor or a difference between the attenuated voltage across the capacitor and a reference voltage, with a voltage formed across the capacitor of the ramp generation circuit 400, 450. Also, the dither module 72' may be configured to dither a charging current (via 402 or 452) and/or a capacitance (via 404) of the ramp generating circuit 450, 452 to add the dither to the length of the control cycle the control signal 26'. The variable current source 402 or 452 may be implemented using a plurality of transistors in a switchable current mirror configuration such that the number or transistors acting as the current mirror can be controlled by way of a digital signal.

The ramp generating circuits 450, 452 of the above-described embodiments are implemented using analogue electronics. However, in some other embodiments, the charging circuit may be replaced by a suitably configured digital electronics or be implemented in software running on a processor. For example the dither and PWM encoding function may be implemented by a digital counter circuit. The counter circuit may generate an output by incrementing a count value based on a specific counting increment and counting rate. The count value may begin at its lowest value, such as zero, and increase. As before, the control signal 26' may begin 'low'. The count value may be compared with a signal representative of the voltage across the capacitor. This can be done by using an analog to digital converter to digitize the voltage or the counter may drive a digital to analog converter to form an analog representation of the counter value and the comparison be done by an analog comparator. When the count value reaches the value of the signal representing the voltage across the reservoir capacitor 208, the control signal 26' may transition from 'low' to 'high' indicating that the oscillator should be enabled so as to cause power to be transferred across the isolation barrier. At the end of the control cycle, the signal representing the voltage across the reservoir capacitor may be updated, the counter circuit is reset, and the control signal 26' is returned to 'low' such that the control sequence can be repeated. Accordingly, in an analogous manner to as described above with reference to the analogue implementations, the difference or other suitable input signal, the counter increment, and/or the counter rate may be dithered to dither a control cycle length or mark-space ratio of the control signal 26'.

Accordingly, the dither module 72' may include a counter circuit configured to generate the control signal 26' by comparing the input signal with a counter value of the counter circuit. Also, the dither module 72' may be configured to dither at least one of: a) the input signal; b) an offset applied to the voltage from the ramp generator (for example in the digital world by preloading the counter with a non-zero value and in the analog implementation by switching a resistor is series with the capacitor 404, for example between the capacitor 404 and the ground rail; c) a counter increment size, and d) a counter update rate to add the dither to the control signal 26'.

Based on the above-described operation of the monitor 32', the control signal 26' is generated and includes a duty cycle of activation of the oscillator 18'. As seen more particularly on FIG. 7, the controller 32' may include an encoder 310 which is configured in use to encode the control signal 26' such that it can be transferred across the isolation barrier 4' from the second side 12' to the first side 10' by the isolator 8'. In an embodiment, the control signal 26' may be converted into an oscillating signal in order to be transferred across the isolation barrier 4', for example, when the isolator 8' is a transformer. Alternatively, the control signal 26' may be converted into an optical signal in order to be transferred across the isolation barrier 4', for example, when the isolator 8' is an opto-coupler.

In the embodiment described with respect to FIG. 7, the isolator 8' is a second transformer having a primary winding 600 coupled to the controller 32' and a secondary winding 602 coupled to the driver 24'. Additionally, the driver 24' may include a decoder 604 and control logic 606.

The decoder 604 is coupled to the secondary winding 602 so as to receive the oscillating control signal 26' therefrom. The decoder 604 performs a cooperating decoding operation to the encoding operation of the encoder 310. An output of the decoder 604 is coupled to the control logic 606 such that the decoder 604 outputs the decoded control signal 26' to the control logic 606. In an embodiment, during steady state operation, the control logic 606 does not perform any function on the decoded control signal 26' and so that the transistor 132 is switched on and off based on the duty cycle of the control signal 26'. Accordingly, in some embodiments, the control logic 606 may be omitted and the transistor 132 may be coupled to the output of the decoder 604. However, in some embodiments, the control logic 606 operates when the system 2' is turned on so as to activate the transistor 132 such that the oscillating power signal 20' is generated and charge begins to become stored by the power receiver 28'. Also, this can provide power to the controller 32'. In any case, the transistor 132 is controlled based on the control signal 26' so as to activate and deactivate the oscillator 18' based on the control signal 26'. It is to be understood that in different embodiments, various aspects of the controller 32', isolator 8' and driver 24' may be different. For example, the encoder 310 and the decoder 604 may be omitted if the control signal 26' and the isolator 8' are configured such that the control signal 26' does not need to be encoded in order to be transferred across the isolation barrier 4' from the second side 12' to the first side 10' by the isolator 8'. In an embodiment, the encoder 310 and the decoder 604 operations are associated with the isolator 8'. For example, when the isolator 8' is a transformer, the encoder 310 and decoder 640 may perform on-off keying. Instead of a transformer, the isolator 8' may be a capacitor, or an opto-coupler. In another embodiment, the encoder 310 and decoder 604 may use a pulse encoding/decoding scheme, such as that described in international patent application publication no. WO 2004/100473.

It is to be understood that according to the above-described embodiments both the dither circuit 70, 70' and the dither module 72, 72' may be present. However, in some embodiments one of the dither circuit 70, 70' or dither module 72, 72' may be omitted. An advantage of omitting features in this way is that the system 2, 2' may be less complicated and, therefore, may occupy less chip area and may consume less power. However, including only one of the dither circuit 70, 70' and dither module 72, 72' may cause the interference generated by the power transfer system 2 or 2' to be more problematic to neighboring electronic components since the noise may be less spread out over a frequency range and may be more focused at a particular frequency.

The above-described embodiments provide a method of transferring power across an isolation barrier. Specifically, an oscillating power signal is generated in a first side of the isolation barrier. The oscillating power signal is then transferred from the first side of the isolation barrier to a second side of the isolation barrier. At the second side of the isolation barrier, electrical energy is recovered from the transferred oscillating power signal and the stored electrical charge may be used to power a load circuit at the second side of the isolation barrier.

Also at the second side, a control signal is generated. The control signal defines a duty cycle of activation of the oscillator which is based on an amount of electrical charge stored at the second side of the isolation barrier. Once generated, the control signal is transferred from the second side of the isolation barrier to the first side of the isolation barrier such that the oscillating power signal is generated in accordance with instructions conveyed by the control signal. It is also possible to dither the phase of the oscillator.

Additionally or alternatively, a dither is added to the duty cycle or cycle length of the control signal. Specifically, generating the control signal includes, first, generating a signal which varies based on the amount of electrical charge stored at the second side of the isolation barrier and, second, setting the duty cycle (mark-space ratio) of the control cycle or length of the control cycle as a function of the voltage at the reservoir capacitor. It is to be understood that dithering the duty cycle of the control signal has the effect of dithering a parameter of the oscillating power signal to spread noise generated by the system. As described above, the oscillator may generate an oscillating signal when the control signal is high, but may not generate an oscillating signal when the control signal is low. Therefore, portions of the oscillating power signal will include oscillations when the oscillator is activated and portions of the oscillating power signal will not include oscillations when the oscillator is deactivated. In this way, the oscillating power signals includes oscillating portions and non-oscillating portions, wherein the size and position of these portions is defined by the duty cycle of the control signal. Accordingly, dithering the duty cycle dithers a parameter of the oscillating power signal because the relative size and position of the oscillating and non-oscillating portions of the oscillating power signal is caused to dither.

Figure 13:
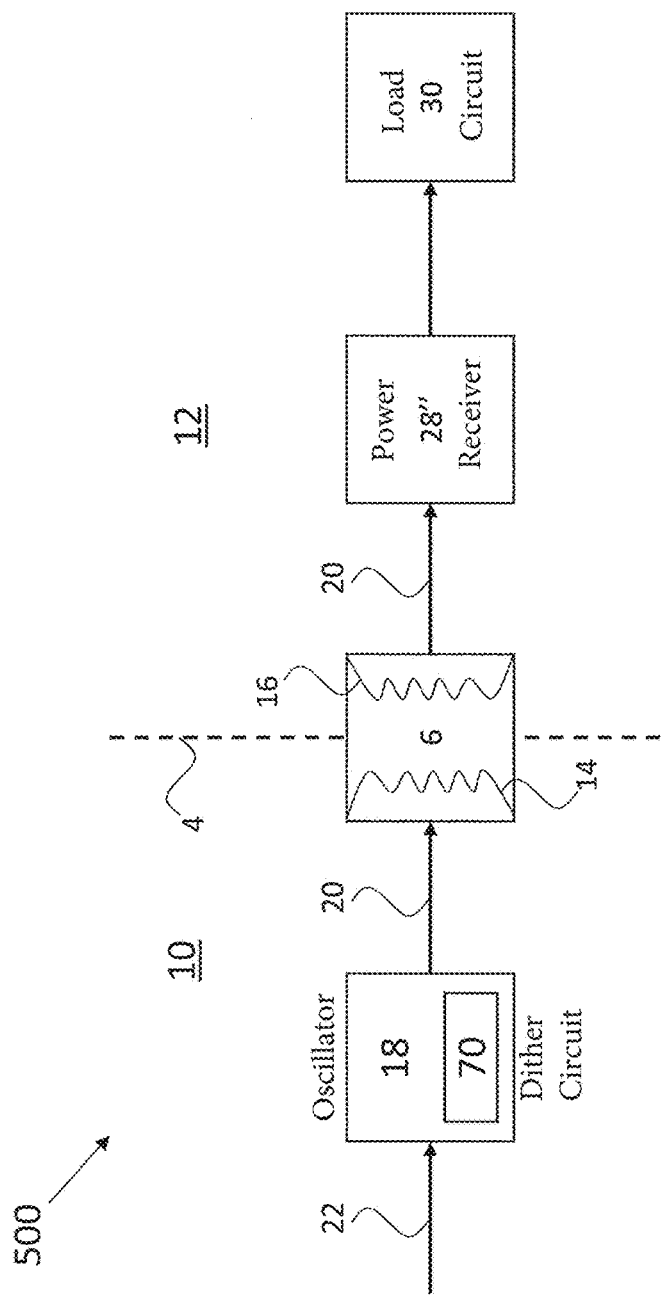
FIG. 13 is a schematic block diagram of a system for transferring electrical power across an isolation barrier, in accordance with another embodiment of this disclosure.

FIG. 13 shows a system 500 in accordance with another embodiment. The system 500 includes some but not all of the features of the system 2 of FIG. 5 and system 2' of FIG. 7. Specifically, the system 500 includes the above-described oscillator 18 having the dither circuit 70. As before, the oscillator 18 generates the oscillating power 20 signal 20, and the oscillator 18 includes the dither circuit 70 which dithers the oscillating frequency of the oscillating power signal 20. The oscillating power signal 20 is established in the primary winding 14 of the transformer 6, and is transferred from the primary winding 14 to the secondary winding 16. The transferred oscillating power signal 20 is provided to a power receiver 28". The load circuit 30 receives power from the power receiver 28" so as to operate. In this way, power may be generated on the first side 10 and transferred across the isolation barrier 4 to the second side 12 where it can be used to power the load circuit 30.

In this embodiment, the power receiver 28" may be as described above. For instance, the power receiver 28" may be as the power receiver 28' and include a storage device (e.g. a capacitor). The storage device stores electrical charge and provides stored electrical charge to the load circuit 30. However, in another embodiment, the power receiver 28" may not store charge and, instead, may simply relay electrical charge from the transferred oscillating power signal 20 to the load circuit 30 without storing the electrical charge. For example, the power receiver 28" may include a rectifier circuit for converting the AC oscillating power signal 20 into a DC signal for powering the load circuit 30. The DC signal may be transferred directly to the load circuit 30 rather used to charge a storage device such as a capacitor.

In the embodiment shown in FIG. 13, the system 500 does not include a controller, a feedback isolator, or a driver. Therefore, the system 500 does not generate a control signal. Instead, the system 500, when activated, provides a permanent dithered oscillating power signal 20 to supply electrical charge to the load circuit 30. The oscillating power signal 20 can be deactivated by deactivating the system 500. An advantage of the system 500 compared to the systems 2 and 2' is that the system 500 does not generate the second noise component because the oscillator 18 is constantly activated rather than being activated and deactivated cyclically due to a constant duty cycle of activation of the control signal when in steady state conditions. Also, the system 500 is less complicated and, therefore, occupies less chip area and consumes less power. However, an advantage of the systems 2 and 2' compared to the system 500 is that the systems 2 and 2' include a feedback feature which avoids oversupplying power to the second side and, in this way, conserves power. For embodiments not including feedback, a voltage clamp or other dissipative load can be provided to provide regulation of the output voltage. Thus efficiency is traded for simplicity.

As a further option, the voltage at the reservoir capacitor may be provided to a further DC to DC converter such as a buck regulator, a boost circuit or a buck-boost circuit. This provides voltage stability for the load and can tolerate much larger voltage fluctuation at the output of the power receiver.

Figure 14:
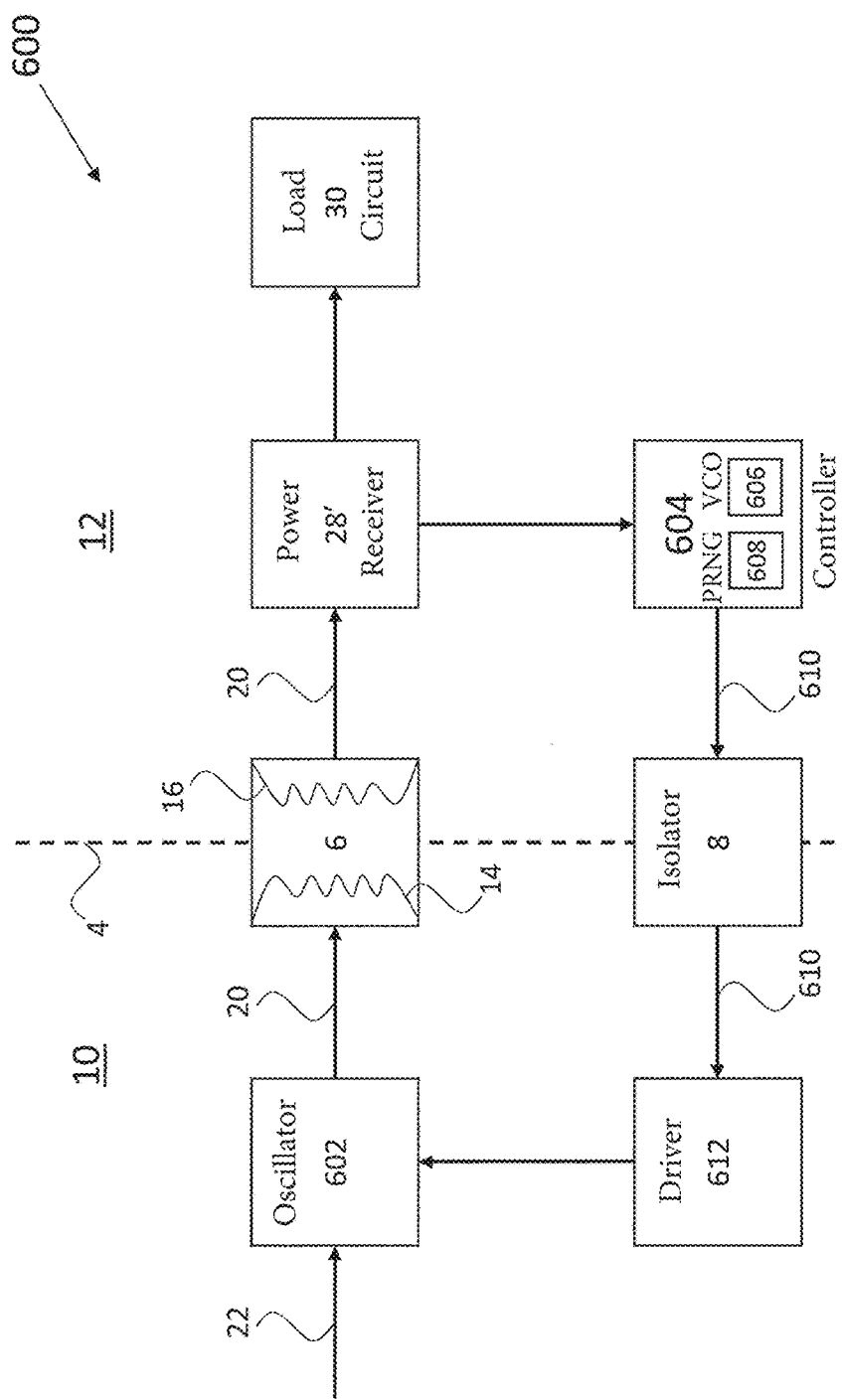
FIG. 14 is a schematic block diagram of a system for transferring electrical power across an isolation barrier, in accordance with a further embodiment of this disclosure.

FIG. 14 shows a system 600 in accordance with another embodiment. The system 500 includes some but not all of the features of the system 2 of FIG. 5 and system 2' of FIG. 7. Specifically, the system 600 includes the above-described oscillator 18 but optionally without the dither circuit 70. For instance, the oscillator 18 may include only a pair of cross coupled transistors (such as the transistors 100 and 101 of FIG. 7). As before, the oscillator 18 generates the oscillating power signal 20, but this time the oscillating frequency of the oscillating power signal 20 is constant because the dither circuit 70 is absent. The oscillating power signal 20 is established in the primary winding 14 of the transformer 6, and is transferred from the primary winding 14 to the secondary winding 16. The transferred oscillating power signal 20 is provided to a power receiver 28 for electrical charge storage. The load circuit 30 receives stored electrical charge from the power receiver 28 so as to operate. In this way, power is received on the first side 10 and transferred across the isolation barrier 4 to the second side 12 where it can be used to power the load circuit 30.

In an embodiment, the power receiver 28 may be as described above. For instance, the power receiver 28 may be as the power receiver 28' and include a rectifier circuit 5 (such as the rectifier circuit of FIG. 7) and a storage device (such as the capacitor 208 of FIG. 7). The storage device may store electrical charge and provide stored electrical charge to the load circuit 30.

In the embodiment illustrated in FIG. 14, the system 600 includes a controller 604 which is coupled to the power receiver 28. In the embodiments described earlier, the controller 32' provided a control signal 26' having a duty cycle which regulated the flow of power from the first side to the second side. Since the control signal 26' regulated flow, under and over supply of power to the power receiver 28' could be avoided. Unfortunately, however, under steady state conditions, this regulating aspect could generate noise by virtue of a constant or near constant charging and discharging cycle. Therefore, in the present alternative embodiment, regulation may be replaced by a randomized control signal so as to avoid noise generated by virtue of a constant or near constant charging and discharging cycle. Specifically, the monitor 604 may include a voltage controlled oscillator (VCO) 606 and a pseudo random number generator (PRNG) 608.

In this embodiment, as before, the controller 604 generates a signal representative of an amount of charge stored by the power receiver 28. For example, the controller may include the voltage divider of FIG. 7. In any case, this signal may be provided to the VCO 606 so as to generate a frequency signal having a frequency which varies based on an amount of charge stored by the power receiver 28. The frequency signal may then be used as a clock signal for the PRNG 608. In this way, the PRNG 608 may generate a pseudo random sequence of 1s and 0s at a rate which depends on the frequency of the VCO, which in turn depends on an amount of charge stored by the power receiver 28'. The controller 604 may output the pseudo random number as a control signal 610. A driver 612 is positioned on the first side 10 of the isolation barrier 4 and receives the control signal 610 from the controller 604 via the isolator 8. The driver 612 is coupled to the oscillator 18 so as to control generation of the oscillating power signal 20 based on the control signal 610. For example, the driver 612 may include a transistor (such as the transistor 132 of FIG. 7) which turns on and off based on the value of the most recent bit of the pseudo random number of the control signal 610. That is, the transistor may be turned on when the pseudo random number of the control signal 610 is a "1" and may be turned off when the pseudo random number of the control signal 610 is a "0". This randomized starting and stopping of the oscillation signal spreads it in phase space. A similar effect can be achieved by generating a pseudo-random sequence on a first side of the isolation barrier and driving the oscillator from that sequence. The sequence generator could be clocked at a constant rate or the operation of the oscillator may be used to charge a leaky integrator on the first side of the isolation barrier which is used to drive a VCO. Thus the space taken by the feedback isolator is avoided.

In summary, therefore, the controller 604 is coupled to the power receiver 28 so as to determine an amount of electrical charge stored by the power receiver 28. Also, the controller 604 is configured to generate a pseudo random number sequence which changes value at a rate based on the determined amount of electrical charge stored. The driver 612 is coupled to the controller 604, via the isolator 8, so as to receive the pseudo-random number. Also, the driver 612 is coupled to the oscillator 18 so as to control the oscillator 18 to establish the oscillating power signal 20 in accordance with the pseudo random number value. In particular, the controller 604 comprises an additional oscillator (e.g. the VCO 606) which is configured to generate an oscillating signal having a frequency based on the amount of electrical charge stored at a charge storage device, such as the reservoir capacitor. Also, the controller 604 comprises a pseudo random number generator (e.g. the PSNG 608) configured to change the value of the pseudo random number at a rate based on the frequency of VCO.

Based on the above-described operation, the oscillating frequency of the oscillating power signal 20 is constant if a frequency dither circuit is not included. However, the activation and deactivation of the oscillating power signal 20 are generated in a randomized manner. In this way, interference generated by the oscillating power signal 20 is spread over a frequency range rather than being focused at a particular frequency, such as the oscillating frequency of the oscillating power signal 20. In particular, the amount of electrical charge stored by the power receiver 28 is changing and unpredictable. Therefore, the rate at which the pseudo random number is generated by the PRNG 608 is also changing and unpredictable. Thus, the activation of the oscillator 18 is randomly varied (via the pseudo random number value) at a random rate (via the rate at which the pseudo random number changes value). Accordingly, there are two randomized variables. In this way, a steady state cyclical operation is avoided and, as such, noise generated by the system 600 is spread over a frequency range rather than being focused at a specific frequency.

An advantage of the system 600 is that the controller 604 occupies a relatively small chip area compared to the controller 32 or 32', This is because the VCO 606 and the PRNG 608 occupy relatively small chip areas. For example, the PRNG 608 may be similar to that of FIG. 9, but may include 23 flip flops and 1 exclusive OR gate. In this way, the PRNG 608 may have a pattern length of $8.39 \times 10^6$ bits (i.e. $2^{23}-1$). In an embodiment, the VCO 606 may have a frequency range of 1 MHz to 20 MHz and, the average frequency of the frequency signal may be about 10 MHz. Accordingly, the complete pattern may take about 840 ms (i.e. $8.39 \times 10^6/10^6$). Accordingly, it will take about 840 ms before the pseudo random number starts to repeat its sequence and this is sufficiently long to mean that the interference from the oscillator will be spread out sufficiently over a frequency range. Of course, in some other embodiments, the construction of the PRNG 608 may be different, for example, in some embodiments, the number of flip flops may be more or less than 23. An advantage of having more flips flops is that the pattern will be longer and so the noise will be spread out more. An advantage of having fewer flip flops is that the chip area occupied by the PRNG 608 is less.

In an embodiment, the VCO 606 may include an error amplifier configured to form a difference between a reference voltage and a voltage representative of the voltage across the reservoir capacitor, thereby providing for a greater rate of change of VCO output frequency with respect to changes of the output voltage of the power receiver (reservoir capacitor voltage). Further advantages of the system 600 are than the high voltage area of the system 600 is minimized because the regulating feedback aspects are not included and are replaced by the VCO and PRNG which occupy a small area relative to the regulating feedback aspects. That is, the high voltage area is minimized because the oscillator 602 has a fixed frequency and, therefore, it is not necessary to implement spreading of the oscillator frequency, for example, using a dither circuit. Also, power efficiency and the current used to drive the load circuit are maximized. For instance, a fixed oscillation frequency means that power efficiency can be maximized by setting the oscillator 602 to an optimum frequency for power transfer, for example, across transformer 6. As such, the system 600 provides a low cost architecture with two levels of randomness.

According to an embodiment, a system for transferring power across an isolation barrier is provided. The system comprises: a transformer having a primary winding on a first side of the isolation barrier and a secondary winding on a second side of the isolation barrier; and an oscillator configured to establish in the primary winding of the transformer an oscillating power signal which is transferred to the secondary winding of the transformer. The system is configured to dither a parameter of the oscillating power signal to modify a spectral distribution of the oscillating power signal.

In some such embodiments, the oscillator comprises a dither circuit configured to add a dither to an oscillation frequency of the oscillating power signal. In some such embodiments, the dither circuit comprises a plurality of capacitors selectively coupled to the first winding of the transformer, and the coupling of the plurality of capacitors is varied to vary a capacitance connected to the oscillator to add the dither to the oscillating frequency of the oscillating power signal. In some such embodiments, the dither circuit comprises a pseudo random number generator, and the coupling of the plurality of capacitors coupled to the oscillator is modified based on a pseudo random number generated by the pseudo random number generator.

In some embodiments of the system, a power receiver is also provided, coupled to the secondary winding and arranged to rectify a signal received from the secondary winding and to charge a reservoir capacitor.

In some embodiments of the system, a feedback system is also provided, comprising a driver, an isolator and a controller. The controller is coupled to the power receiver so as to be responsive to an amount of electrical charge stored by the power receiver, and is configured to generate a control signal for controlling activation of the oscillator based on the amount of electrical charge stored. The controller provides the control signal to the driver via the isolator, the driver being coupled to the oscillator so as to control the oscillator to establish the oscillating power signal in accordance with the control signal.

In some such embodiments, the controller is configured to add a dither to a cycle time of the control signal or to a duty cycle of the control signal. In some such embodiments, the controller is configured to dither a signal representative of a voltage across a charge store connected to or part of the power receiver to add the dither to the control signal. In some such embodiments, the controller further comprises a charging circuit configured to generate a time varying signal and to generate the control signal by comparing a signal representative of the voltage at the power receiver with the time varying signal, wherein the controller is configured to dither a charging current and/or a capacitance of the charging circuit to add the dither to the control signal.

In some embodiments of the system having the controller, the controller comprises a counter circuit configured to generate the control signal by comparing a signal representing the voltage across a charge store with a counter value of the counter circuit, and the controller is configured to dither one or more of: a counter increment; a counter rate of the counter circuit; an initial value of the counter; and an offset applied to the signal representing the voltage.

In some embodiments of the system, a load circuit is provided and coupled to the power receiver, wherein the load circuit is powered by consuming the electrical charge stored by the power receiver.

In some embodiments of the system, the system comprises a dither circuit coupled to the oscillator and configured to dither the oscillating power signal. In some such embodiments, the dither circuit is part of the oscillator.

In some embodiments, an isolator contained in a chip scale package is provided, and is adapted to transfer data between first and second voltage domains. The isolator has circuits therein powered by a power transfer system of the type described above.

According to an embodiment, a method of transferring power across an isolation barrier is provided. The method comprises generating an oscillating power signal in a first side of the isolation barrier; transferring the oscillating power signal from the first side of the isolation barrier to a second side of the isolation barrier, and dithering the oscillating power signal to modify a spectral distribution of the oscillating power signal.

In some such embodiments, the method further comprises adding a dither to an oscillation frequency of the oscillating power signal. In some such embodiments, the oscillating power signal is generated by an oscillator and adding the dither to the oscillating frequency of the oscillating power signal comprises varying a capacitance of the oscillator. In some such embodiments, the capacitance is varied in a pseudo random manner.

In some embodiments of the method of transferring power, the method further comprises adding a dither to a duty cycle or cycle length of the control signal used to control whether the oscillator is enabled or disabled. In some such embodiments, the method further comprises generating the control signal based on an amount of electrical charge stored at the second side of the isolation barrier or a voltage at a load on the second side of the isolation barrier, and transferring the control signal from the second side of the isolation barrier to the first side of the isolation barrier and operating the oscillator in accordance with the control signal. In some embodiments of the method, generating the control signal comprises: generating a signal which varies based on the amount of electrical charge stored at the second side of the isolation barrier or a voltage at a load on the second side of the isolation barrier; and setting the duty cycle or cycle time of the control signal as a function of the signal.

According to an embodiment, a system for transferring power across an isolation barrier is provided. The system comprises an isolator and a transformer separating first and second sides of the isolation barrier, the transformer having a primary winding on the first side of the isolation barrier and a secondary winding on the second side of the isolation barrier; an oscillator on the first side of the isolation barrier configured to provide an oscillating power signal to the primary winding of the transformer; a power receiver on the second side of the isolation barrier coupled to the secondary winding of the transformer and configured to store electrical charge from the transferred oscillating power signal in a charge storage device; a control circuit coupled to the power receiver so as to determine a voltage at the charge storage device, and being configured to generate a pseudo random number or sequence which changes value at a rate based on the voltage; and an oscillator driver coupled to the control circuit, via the isolator, so as to receive the pseudo random number and drive the oscillator to establish the oscillating power signal in accordance with the pseudo random number or sequence.

In some such embodiments, the controller comprises an additional oscillator configured to generate a further oscillating signal having an oscillating frequency based on the determined amount of electrical charge stored. The controller comprises a pseudo random number generator configured to change the value of the pseudo random number at a rate based on the oscillating frequency of the further oscillating signal.

According to an embodiment, a method of transferring power across an isolation barrier is provided. The method comprises generating an oscillating power signal in a first side of the isolation barrier; transferring the oscillating power signal from the first side of the isolation barrier to a second side of the isolation barrier; storing electrical charge from the transferred oscillating power signal at the second side of the isolation barrier; generating a pseudo random number which changes value at a rate based on an amount of electrical charge stored at the second side of the isolation barrier; and transferring the pseudo random number from the second side of the isolation barrier to the first side of the isolation barrier such that the oscillating power signal is generated in accordance with the pseudo random number value.

General

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to."

The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

It is to be understood that one or more features from one or more of the above-described embodiments may be combined with one or more features of one or more other ones of the above-described embodiments, so as to form further embodiments which are within the scope of the appended claims.

The claims have been presented in single dependency format suitable for filing with the United States Patent Office. However it is to be understood that each claim can be dependent on any preceding claim of the same type unless that is clearly technically infeasible.

The invention claimed is:

1. A system for transferring power across an isolation barrier, the system comprising:
   a transformer having a primary winding on a first side of the isolation barrier and a secondary winding on a second side of the isolation barrier;
   an oscillator coupled to the primary winding and configured to establish in the primary winding an oscillating power signal; and
   a dither circuit coupled to the oscillator and configured to dither a parameter of the oscillating power signal.

2. The system of claim 1, wherein the dither circuit is configured to add a dither to an oscillation frequency of the oscillating power signal.

3. The system of claim 1, wherein the dither circuit comprises a plurality of capacitors selectively coupled to the primary winding of the transformer.

4. The system of claim 3, wherein the dither circuit comprises a pseudo random number generator configured to control coupling of the plurality of capacitors to the primary winding.

5. The system of claim 1, further comprising a power receiver coupled to the secondary winding and a feedback controller coupled to the power receiver and configured to generate an oscillator activation control signal.

6. The system of claim 5, wherein the feedback controller is configured to add a dither to a cycle time of the oscillator activation control signal or to a duty cycle of the oscillator activation control signal.

7. The system of claim 6, wherein the feedback controller is configured to dither a signal representative of a voltage across a charge storage device connected to or part of the power receiver to add the dither to the oscillator activation control signal.

8. The system of claim 7, wherein the feedback controller further comprises a charging circuit configured to dither a charging current and/or a capacitance of the charging circuit to add the dither to the oscillator activation control signal.

9. The system of claim 6, wherein the feedback controller comprises a counter circuit configured to generate the oscillator activation control signal by comparing a signal representing a voltage across a charge storage device with a counter value of the counter circuit, and wherein the feedback controller is configured to dither one or more of: a counter increment; a counter rate of the counter circuit; an initial value of the counter circuit; or an offset applied to the signal representing the voltage.

10. A method of transferring power across an isolation barrier, the method comprising:
    generating an oscillating power signal in a first side of the isolation barrier;
    transferring the oscillating power signal from the first side of the isolation barrier to a second side of the isolation barrier; and
    dithering the oscillating power signal to modify a spectral distribution of the oscillating power signal.

11. The method of claim 10, wherein dithering the oscillating power signal comprises adding a dither to an oscillation frequency of the oscillating power signal.

12. The method of claim 11, wherein the oscillating power signal is generated by an oscillator having a capacitance, and wherein adding the dither to the oscillating frequency of the oscillating power signal comprises varying the capacitance of the oscillator.

13. The method of claim 12, wherein varying the capacitance of the oscillator comprises varying the capacitance of the oscillator in a pseudo random manner.

14. The method of claim 10, wherein generating the oscillating power signal comprises using an oscillator to generate the oscillating power signal, and wherein dithering the oscillating power signal comprises adding a dither to a duty cycle or cycle length of a control signal used to control whether the oscillator is enabled or disabled.

15. The method of claim 14 further comprising generating the control signal based on an amount of electrical charge stored at the second side of the isolation barrier or a voltage at a load on the second side of the isolation barrier.

16. The method of claim 15, wherein adding a dither to the duty cycle or cycle length of the control signal comprises setting the duty cycle or cycle length of the control signal as a function of the amount of electrical charge stored at the second side of the isolation barrier or the voltage at the load on the second side of the isolation barrier.

17. A system for transferring power across an isolation barrier, the system comprising:
    a transformer separating first and second sides of the isolation barrier, the transformer having a primary winding on the first side of the isolation barrier and a secondary winding on the second side of the isolation barrier;
    an oscillator on the first side of the isolation barrier configured to provide an oscillating power signal to the primary winding of the transformer;
    a power receiver on the second side of the isolation barrier coupled to the secondary winding of the transformer to receive the oscillating power signal;

a control circuit coupled to the power receiver and configured to generate a pseudo random number or sequence; and an oscillator driver coupled to the control circuit and configured to drive the oscillator to establish the oscillating power signal based on the pseudo random number or sequence.

18. The system of claim 17, wherein the control circuit and oscillator driver are coupled via an isolator.

19. The system of claim 17, wherein the oscillator driver is configured to dither an oscillation frequency of the oscillating power signal.

20. The system of claim 17, wherein the control circuit is configured to generate the pseudo random number or sequence based on a voltage stored on the second side of the isolation barrier.

* * * * *